United States Patent
Lee

(10) Patent No.: US 9,905,572 B2
(45) Date of Patent: Feb. 27, 2018

(54) VERTICAL MEMORY DEVICES WITH VERTICAL ISOLATION STRUCTURES AND METHODS OF FABRICATING THE SAME

(71) Applicant: Samsung Electronics Co., Ltd., Suwon-si (KR)

(72) Inventor: Chang-Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 60 days.

(21) Appl. No.: 14/814,623

(22) Filed: Jul. 31, 2015

(65) Prior Publication Data

US 2015/0340377 A1  Nov. 26, 2015

Related U.S. Application Data

(63) Continuation of application No. 14/191,568, filed on Feb. 27, 2014, now abandoned.

(30) Foreign Application Priority Data

Mar. 14, 2013 (KR) ................. 10-2013-0027397

(51) Int. Cl.
| | | |
|---|---|---|
| *H01L 29/792* | (2006.01) | |
| *H01L 27/11582* | (2017.01) | |
| *H01L 29/16* | (2006.01) | |
| *H01L 29/04* | (2006.01) | |
| *H01L 27/11578* | (2017.01) | |
| *H01L 27/11556* | (2017.01) | |
| *H01L 29/66* | (2006.01) | |

(52) U.S. Cl.
CPC .. *H01L 27/11582* (2013.01); *H01L 27/11556* (2013.01); *H01L 27/11578* (2013.01); *H01L 29/04* (2013.01); *H01L 29/16* (2013.01); *H01L 29/66833* (2013.01); *H01L 29/7926* (2013.01)

(58) Field of Classification Search
CPC ......... H01L 27/11582; H01L 27/11578; H01L 27/11556; H10L 27/11582
See application file for complete search history.

(56) References Cited

U.S. PATENT DOCUMENTS

| | | | |
|---|---|---|---|
| 2010/0202206 A1* | 8/2010 | Seol | G11C 16/0408 365/185.17 |
| 2012/0032245 A1* | 2/2012 | Hwang | H01L 27/11551 257/314 |
| 2012/0049267 A1 | 3/2012 | Jung | |
| 2012/0052672 A1 | 3/2012 | Nakanishi et al. | |
| 2012/0052674 A1 | 3/2012 | Lee et al. | |
| 2012/0068247 A1* | 3/2012 | Lee | H01L 27/11551 257/316 |
| 2012/0091521 A1 | 4/2012 | Goda | |

(Continued)

*Primary Examiner* — Jamie C Niesz
(74) *Attorney, Agent, or Firm* — Ward and Smith, P.A.

(57) ABSTRACT

A vertical memory device includes a substrate, a column of vertical channels on the substrate and spaced apart along a direction parallel to the substrate, respective charge storage structures on sidewalls of respective ones of the vertical channels and gate electrodes vertically spaced along the charge storage structures. The vertical memory device further includes an isolation pattern disposed adjacent the column of vertical channels and including vertical extension portions extending parallel to the vertical channels and connection portions extending between adjacent ones of the vertical extension portions.

12 Claims, 44 Drawing Sheets

(56) References Cited

U.S. PATENT DOCUMENTS

| | | | |
|---|---|---|---|
| 2012/0098049 A1* | 4/2012 | Moon | H01L 27/11556 257/324 |
| 2012/0099387 A1 | 4/2012 | Shim et al. | |
| 2012/0126308 A1 | 5/2012 | Kim et al. | |
| 2012/0135583 A1* | 5/2012 | Jang | H01L 27/11582 438/433 |
| 2012/0140562 A1 | 6/2012 | Choe et al. | |
| 2012/0156848 A1* | 6/2012 | Yang | H01L 27/11529 438/287 |
| 2012/0168850 A1 | 7/2012 | Lee et al. | |
| 2012/0170369 A1 | 7/2012 | Kim et al. | |
| 2012/0208347 A1* | 8/2012 | Hwang | H01L 27/1157 438/430 |
| 2013/0093005 A1* | 4/2013 | Yun | H01L 27/1157 257/329 |
| 2013/0140623 A1* | 6/2013 | Lee | H01L 29/792 257/324 |
| 2014/0063890 A1* | 3/2014 | Lee | H01L 27/11519 365/63 |

\* cited by examiner

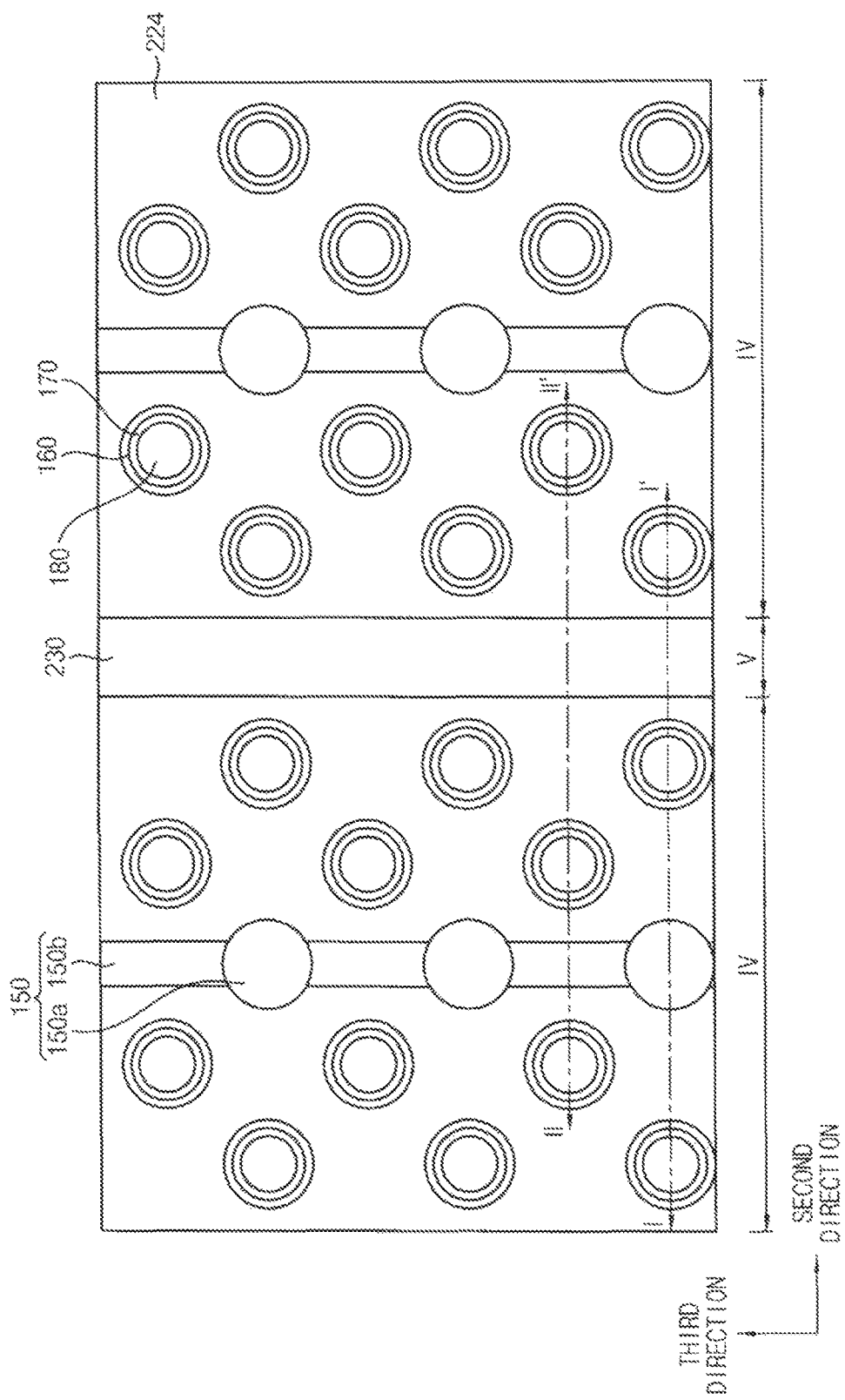

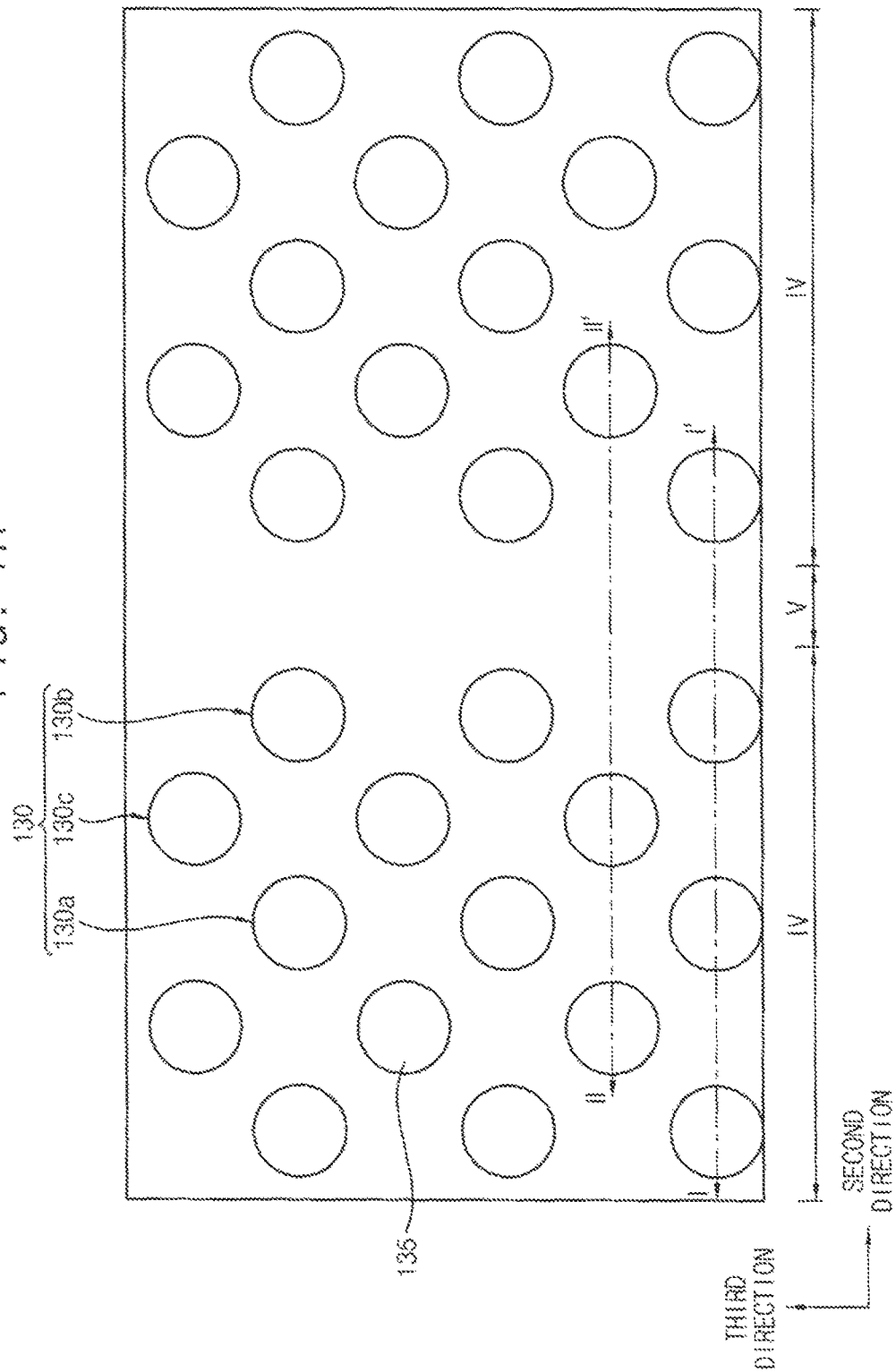

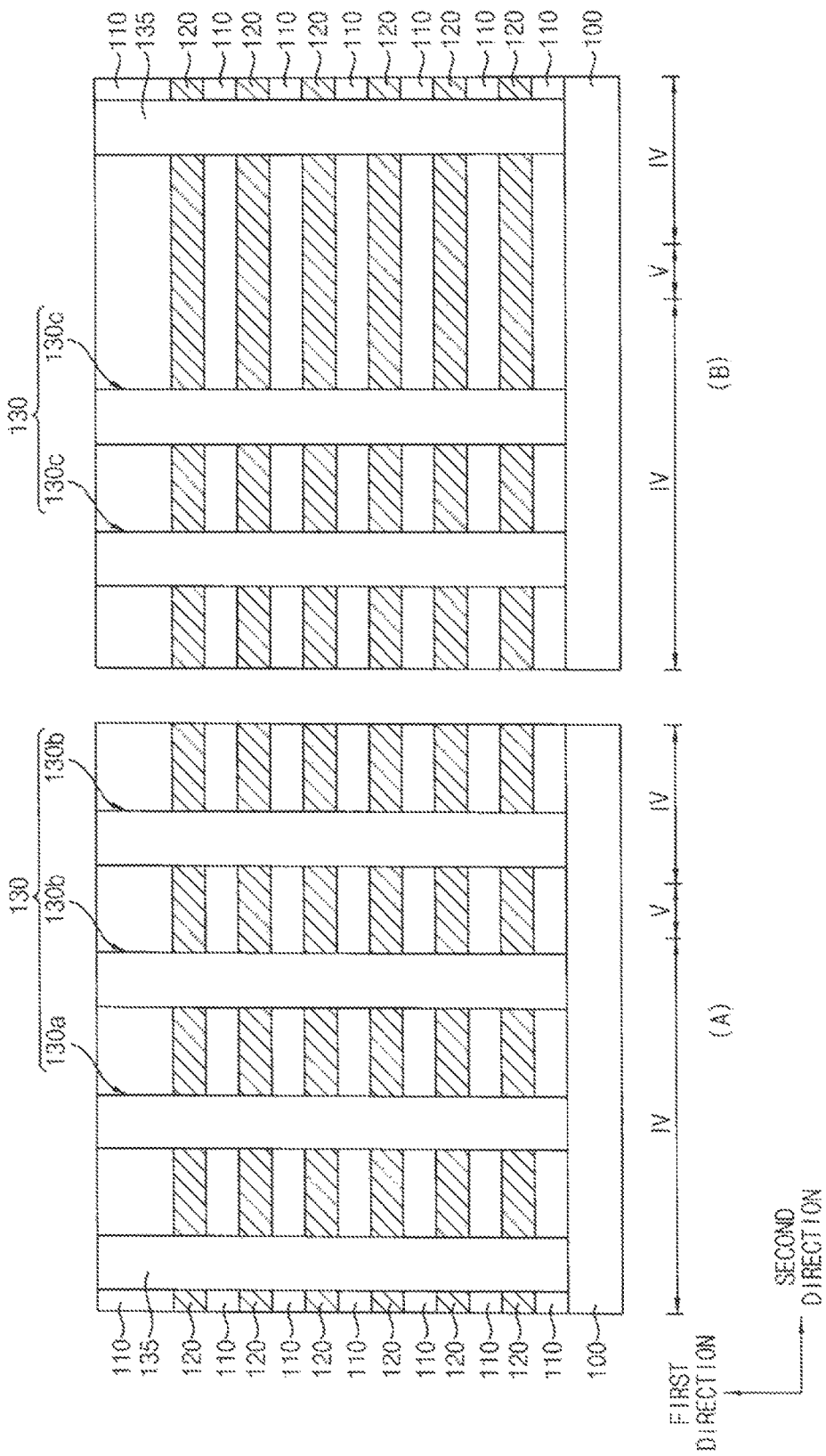

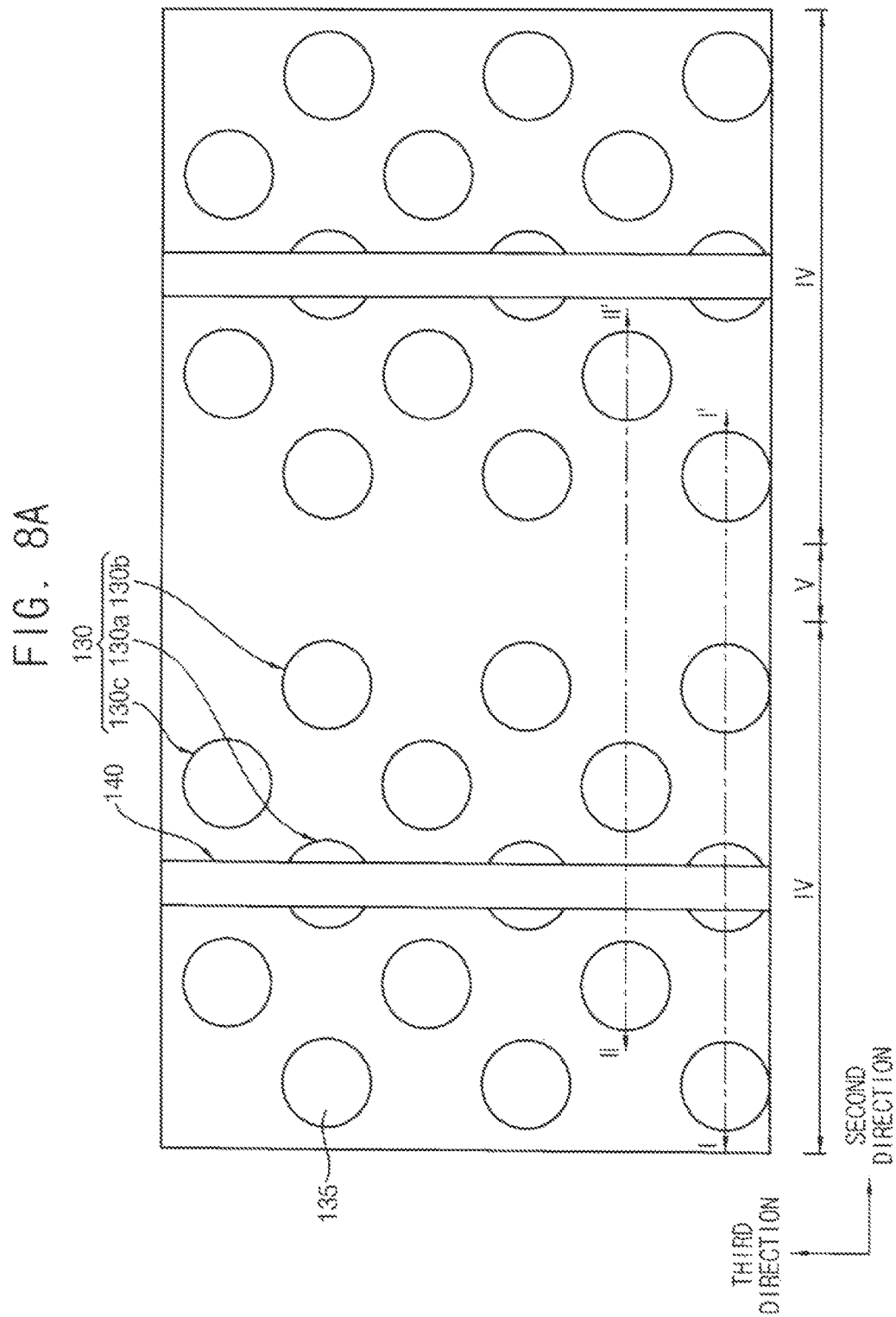

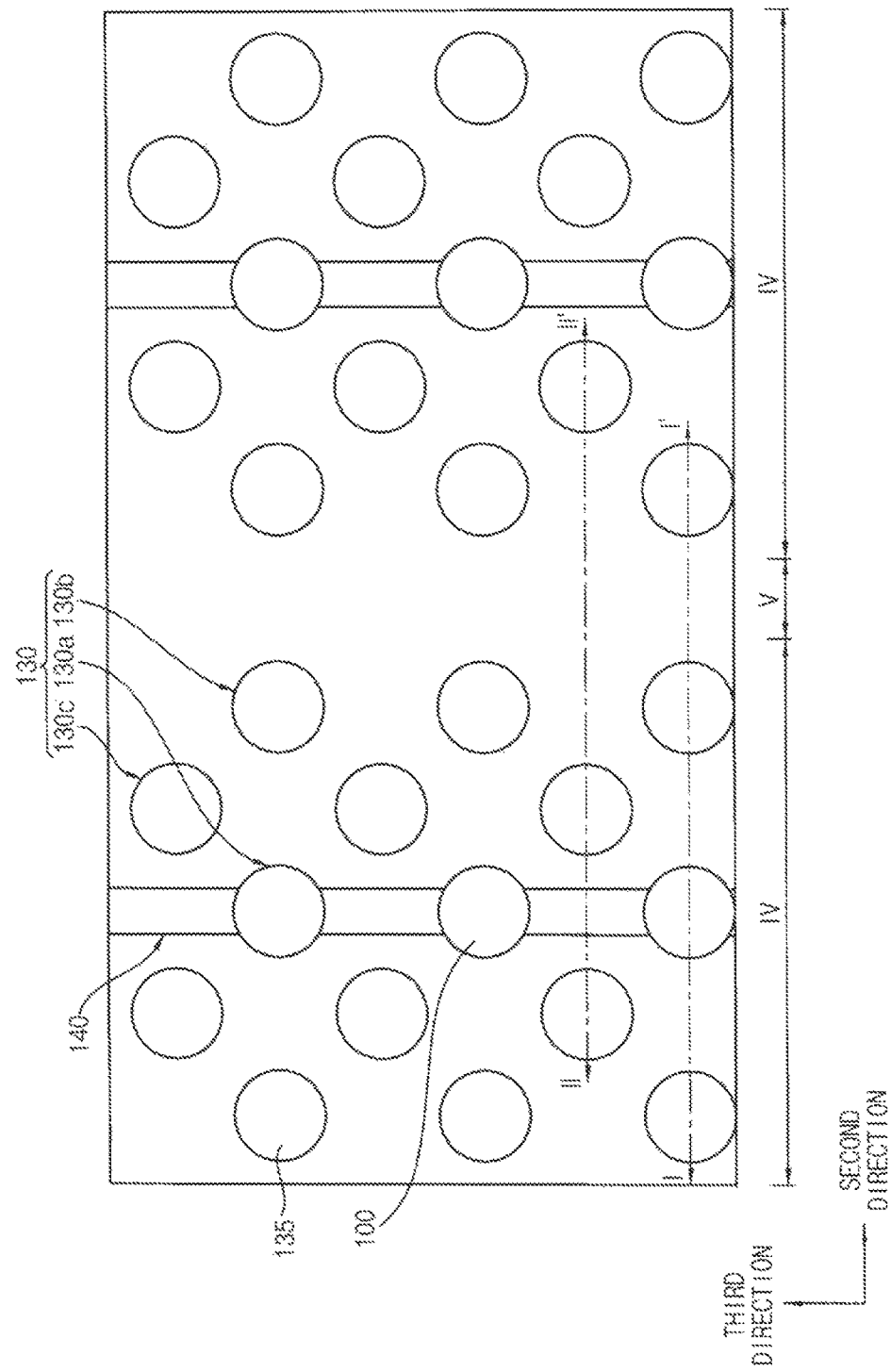

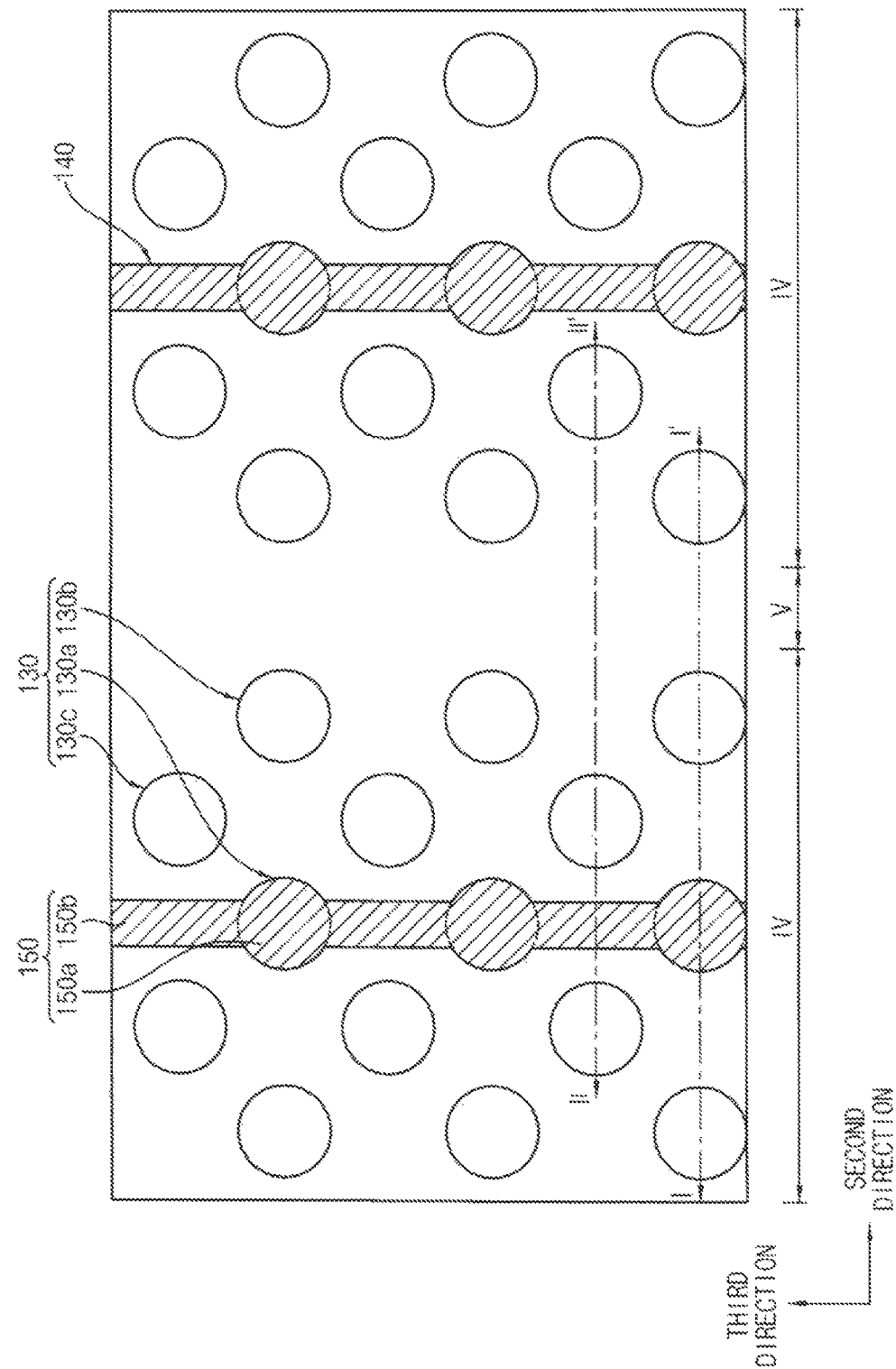

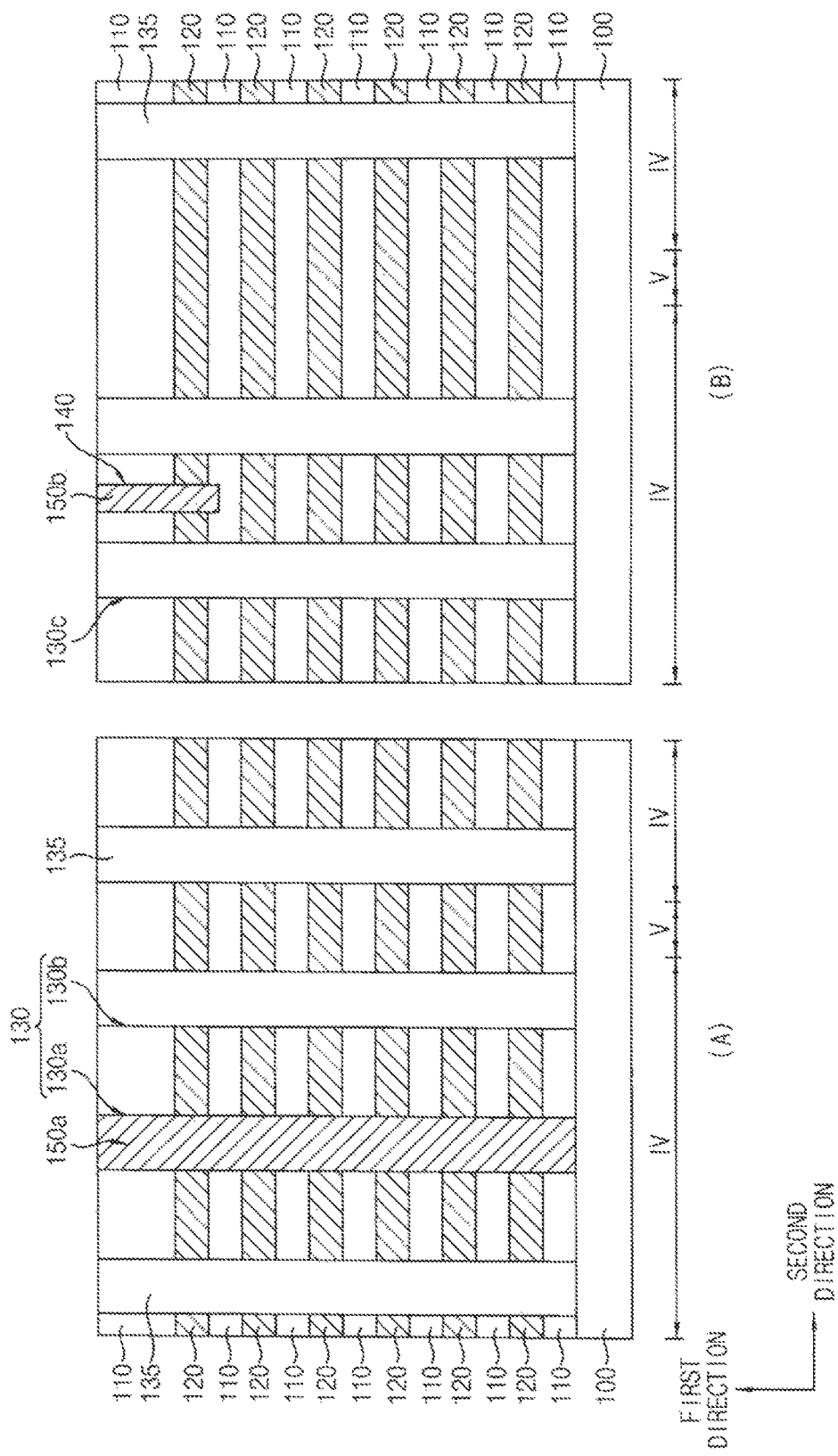

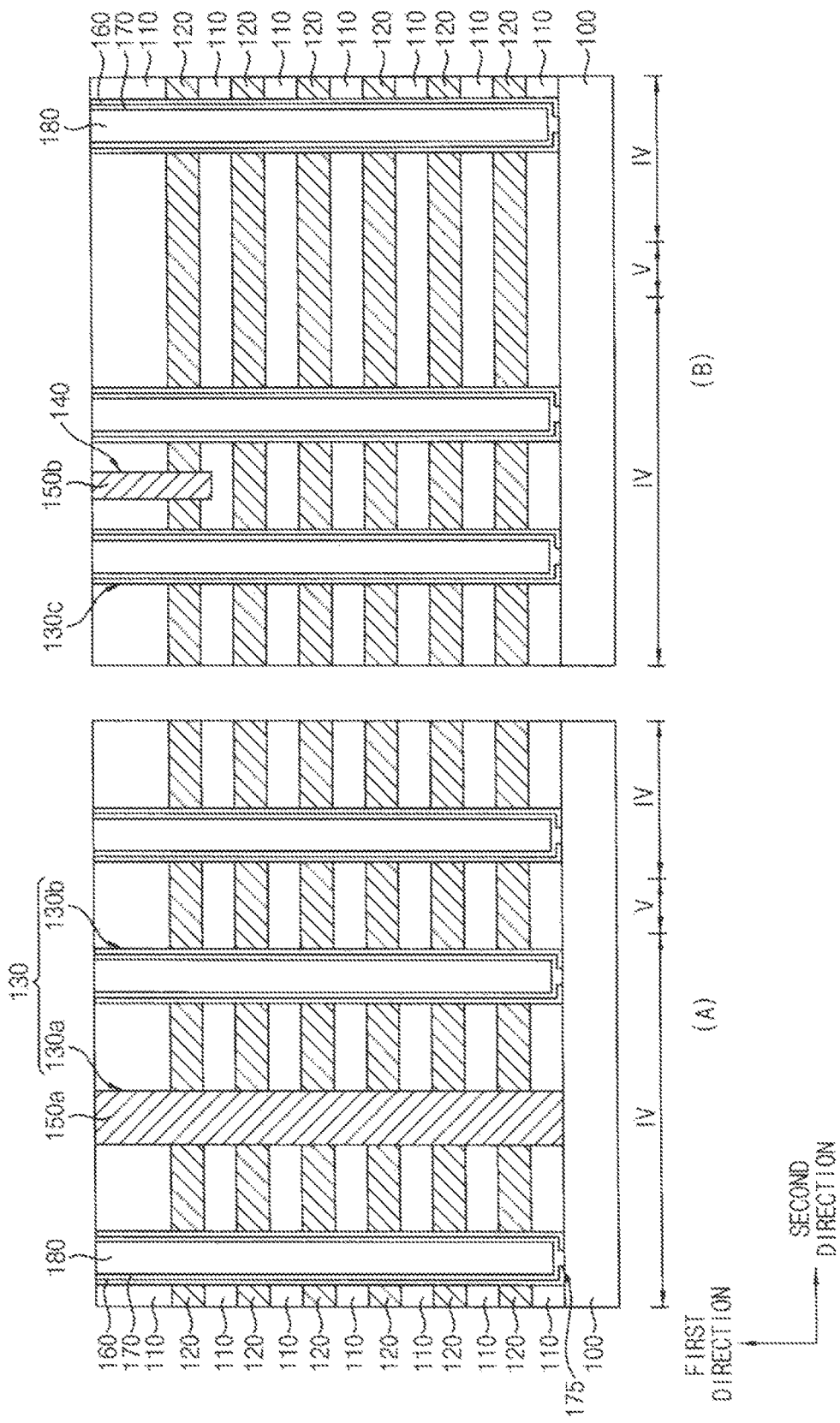

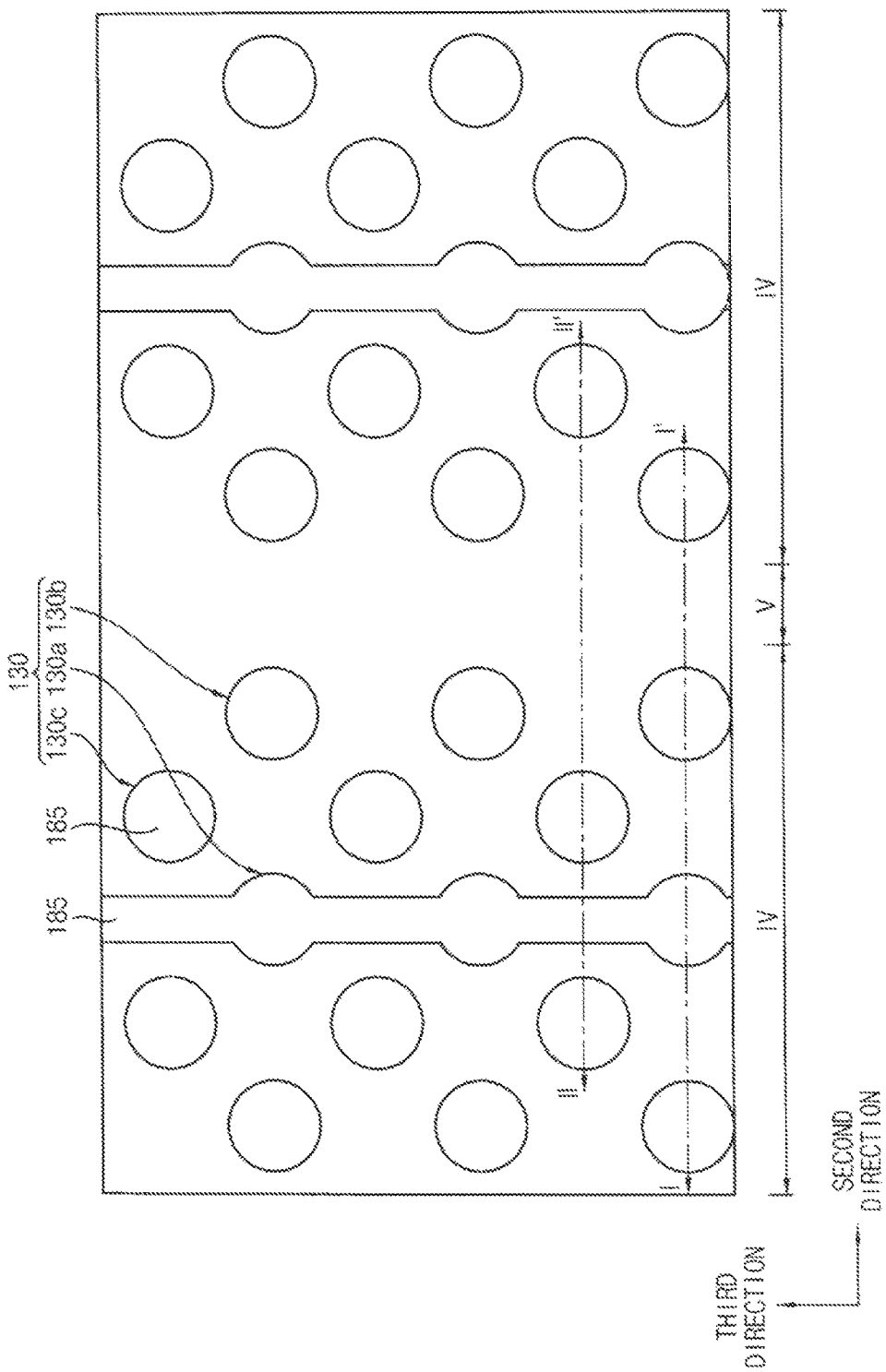

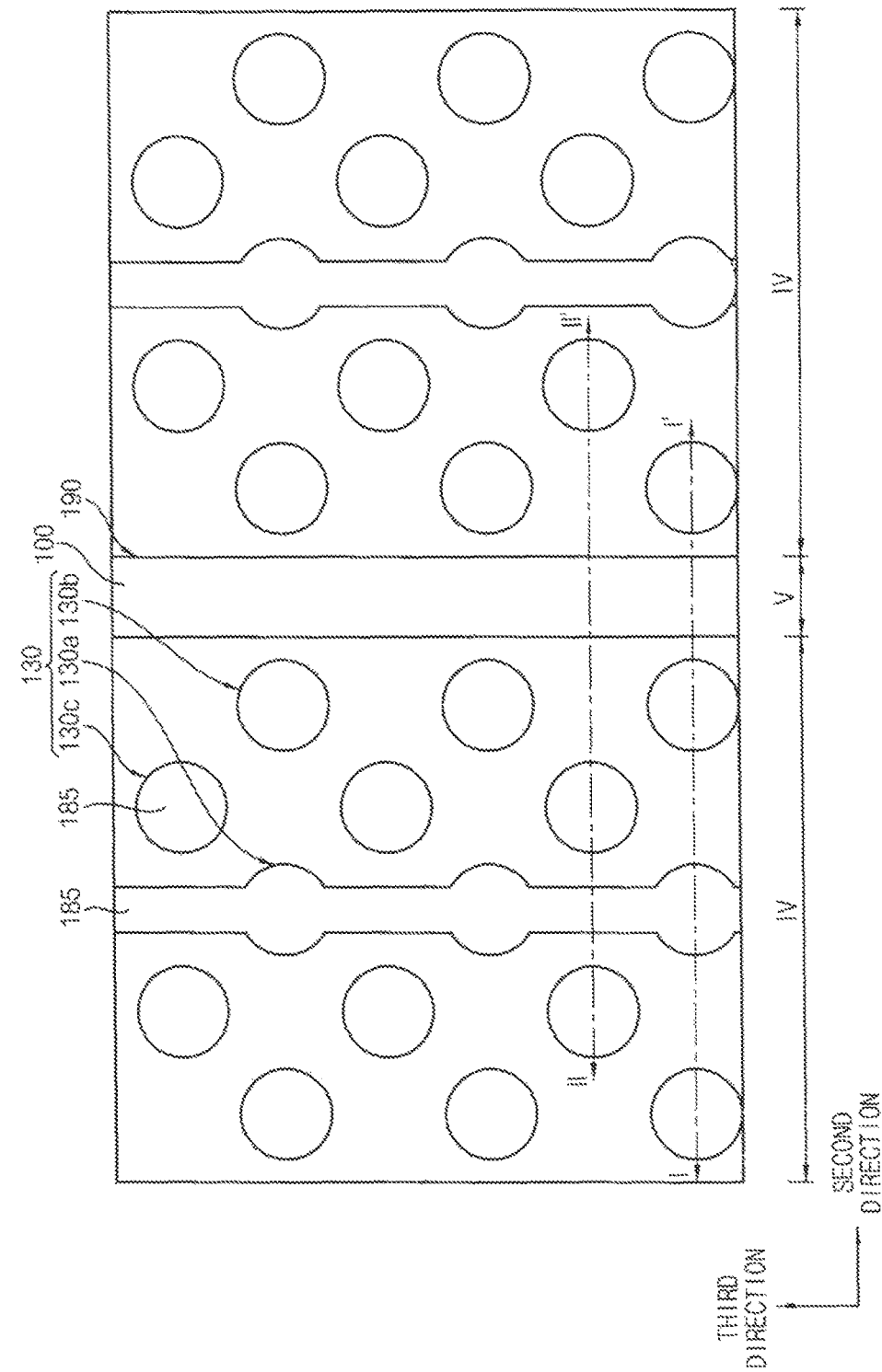

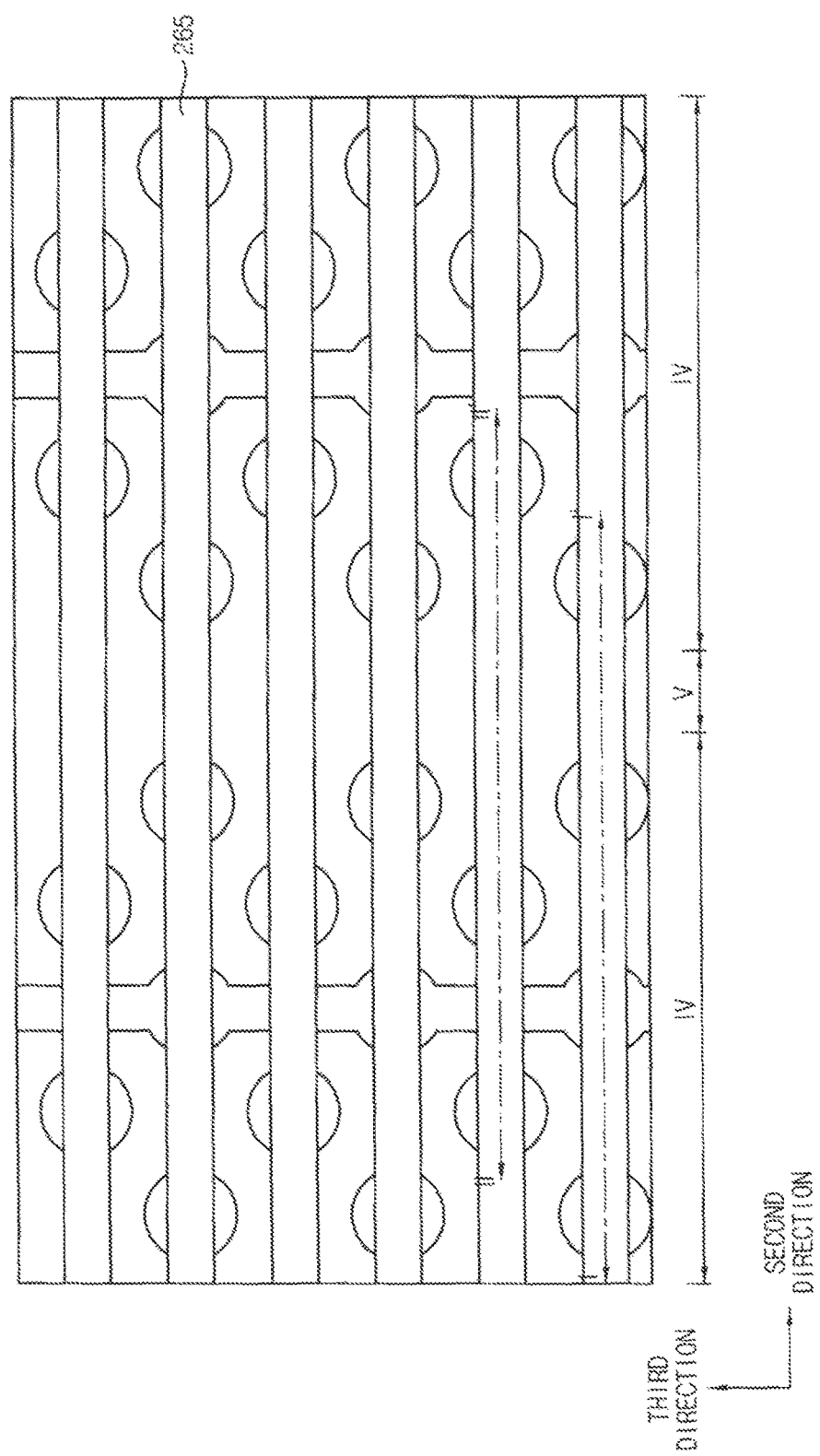

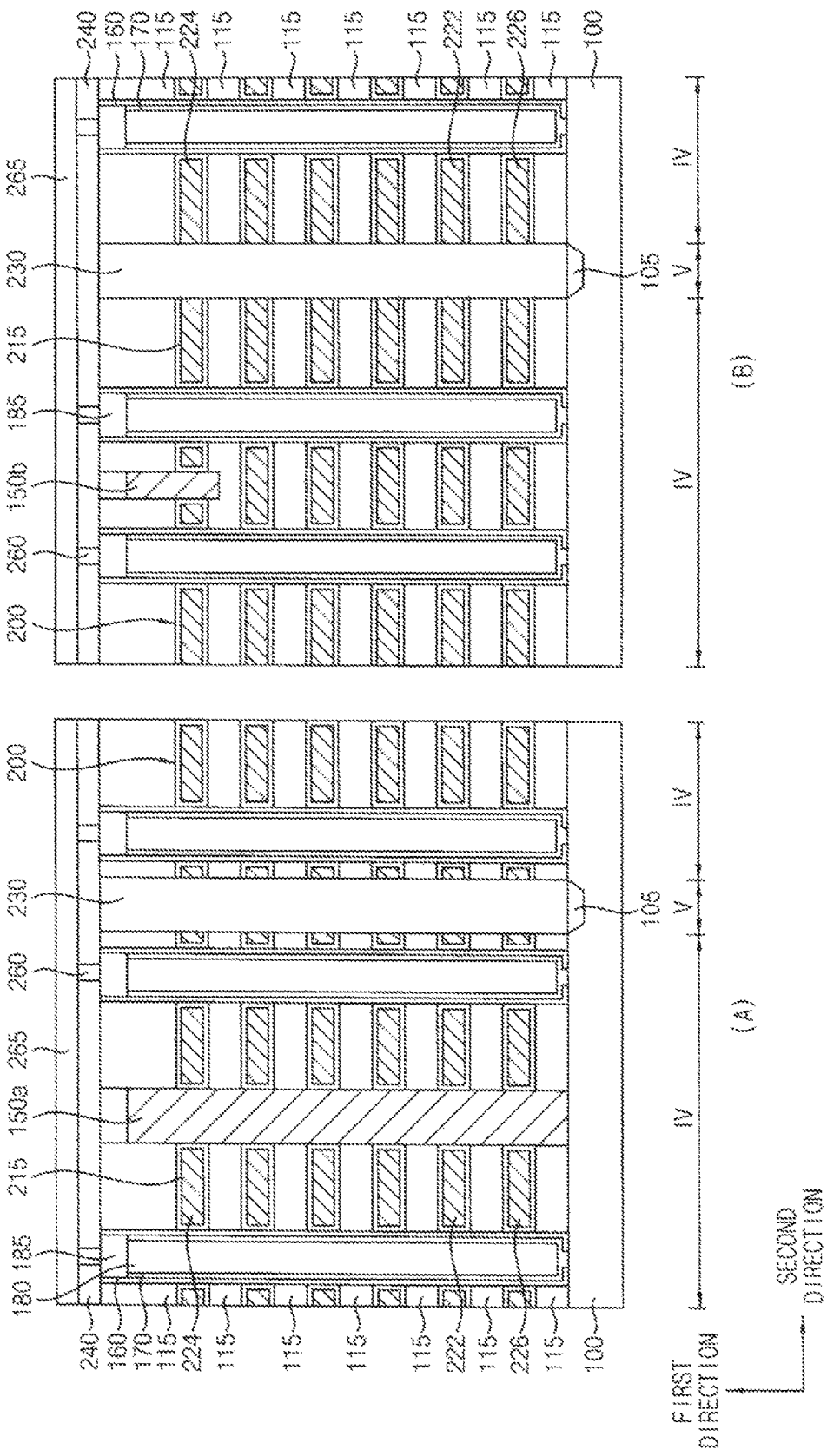

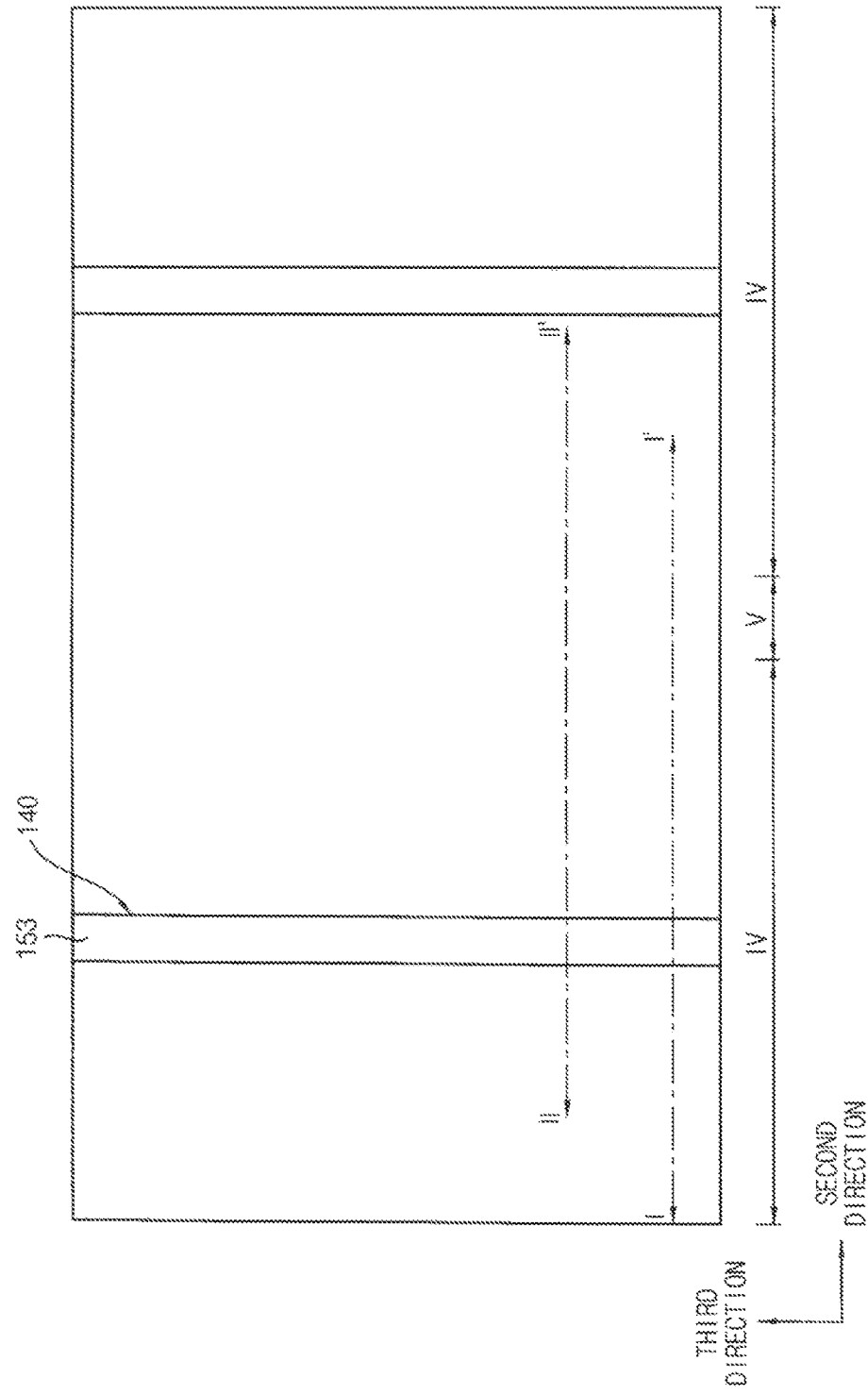

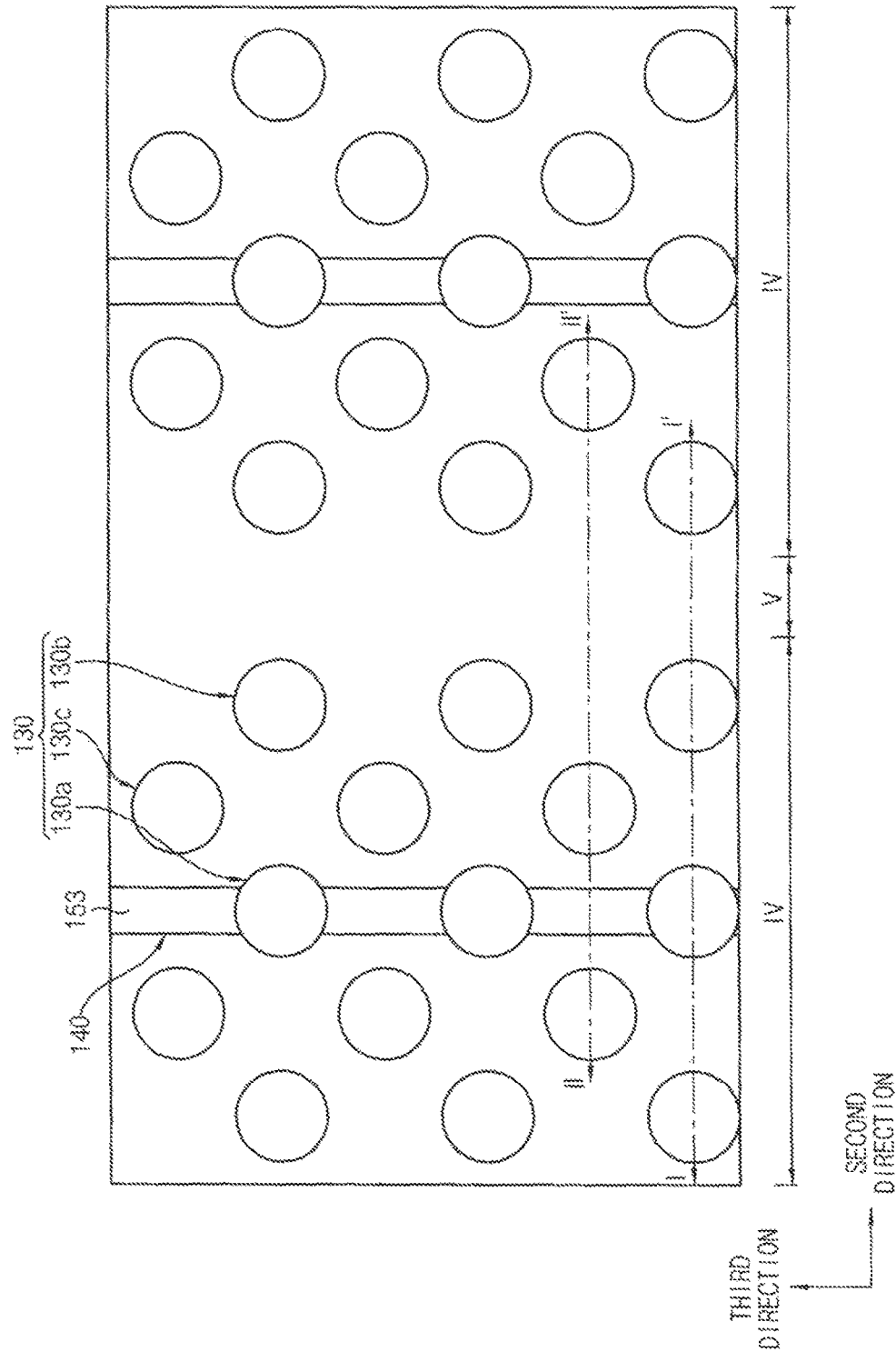

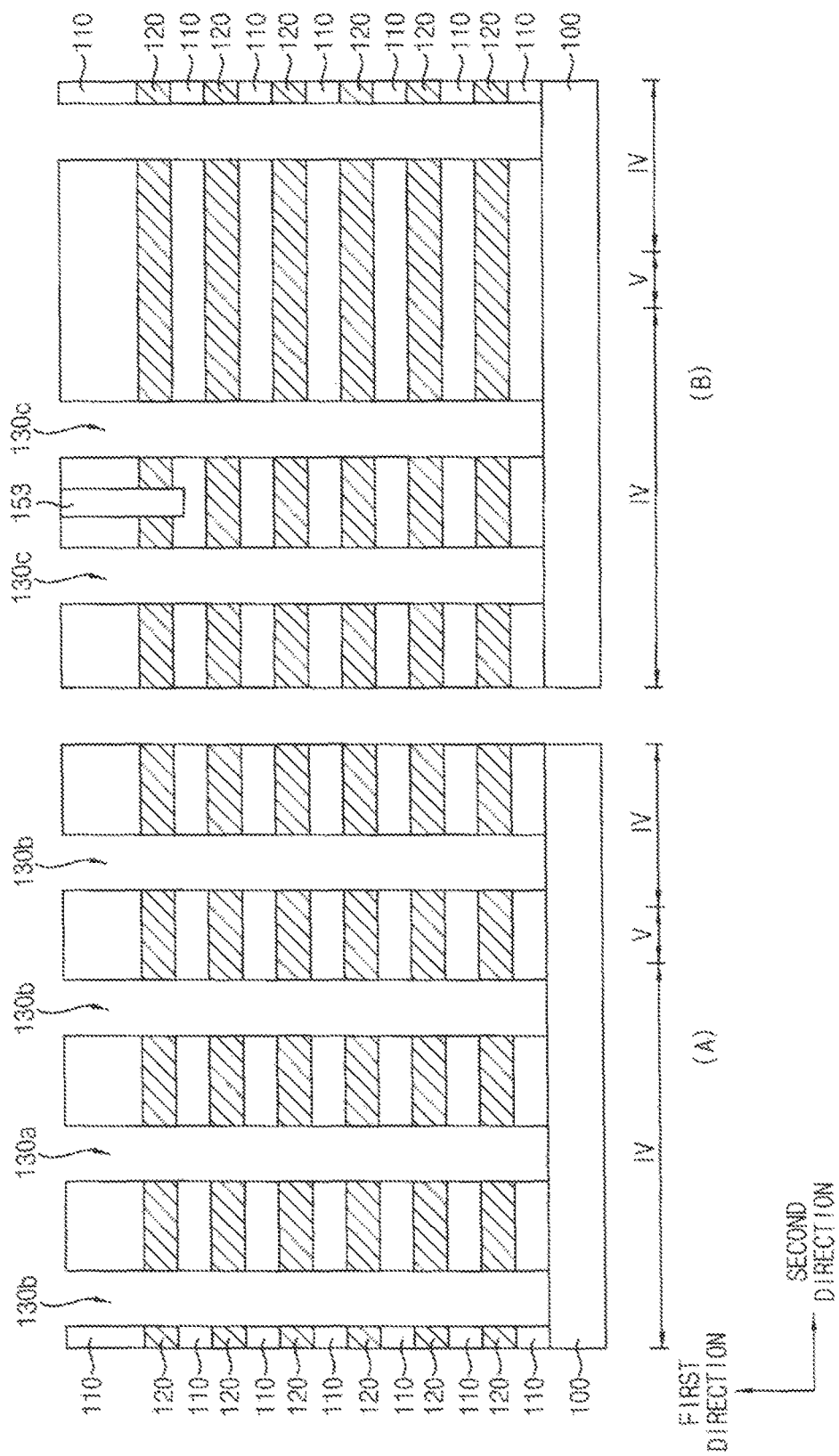

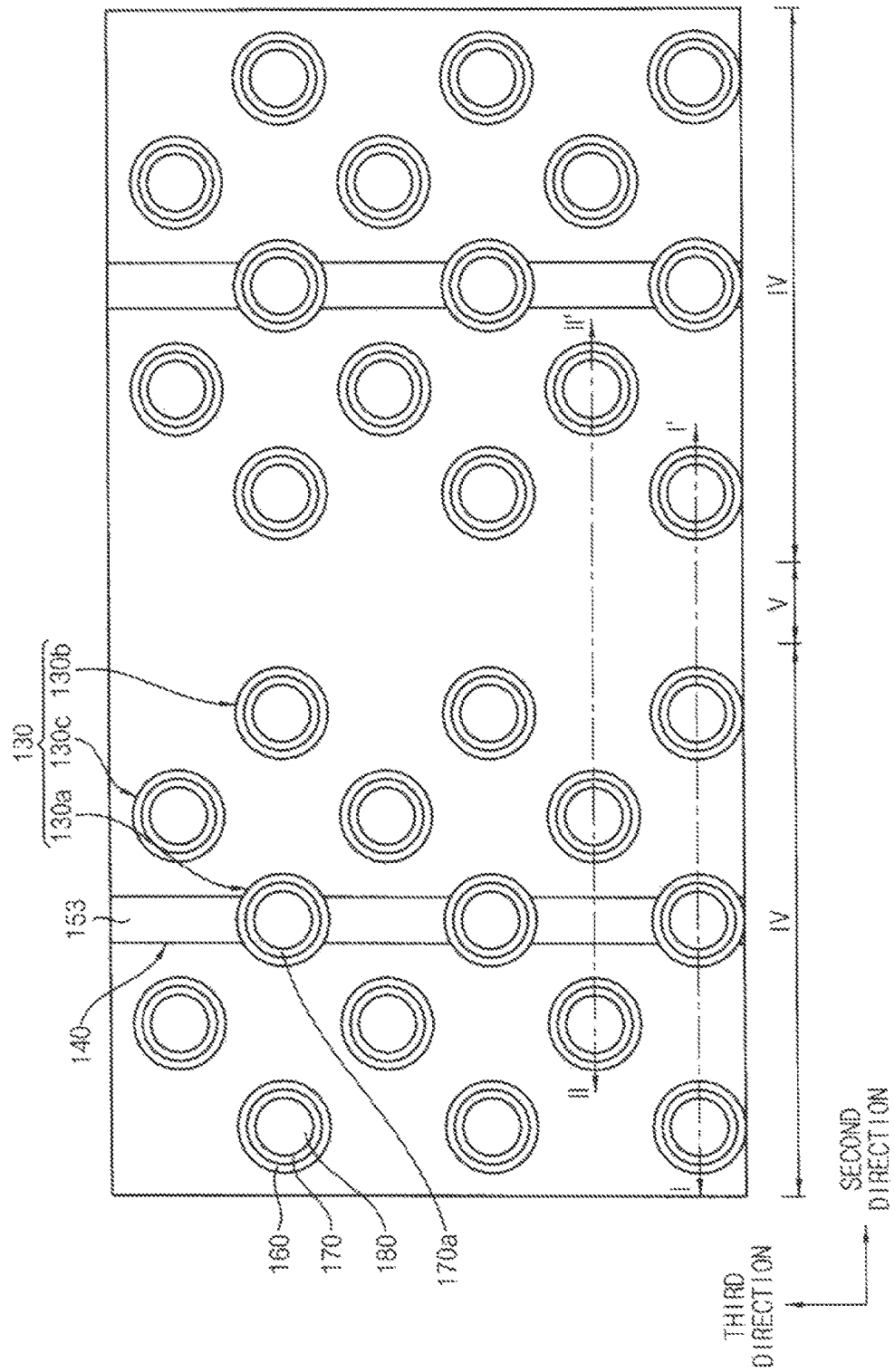

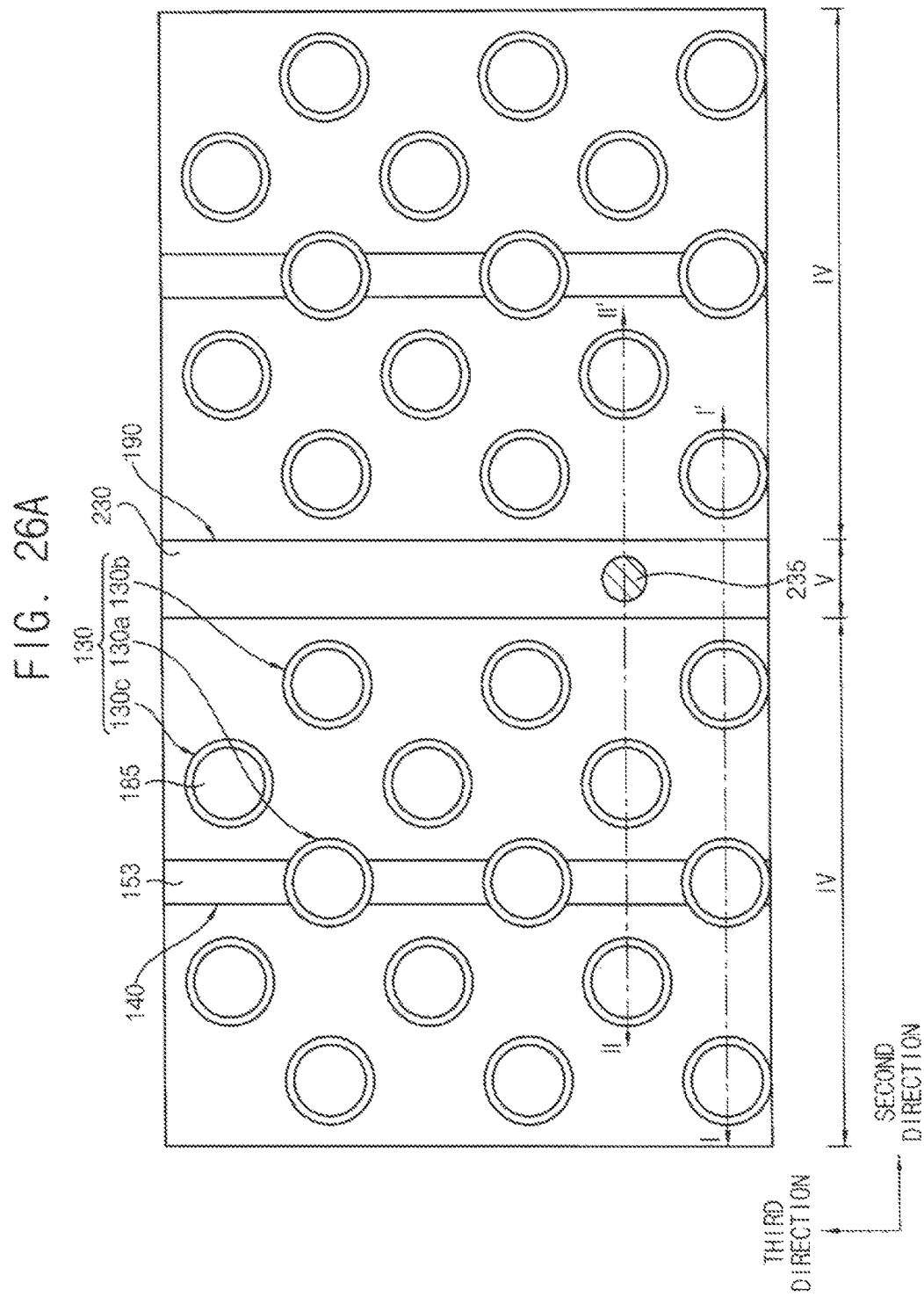

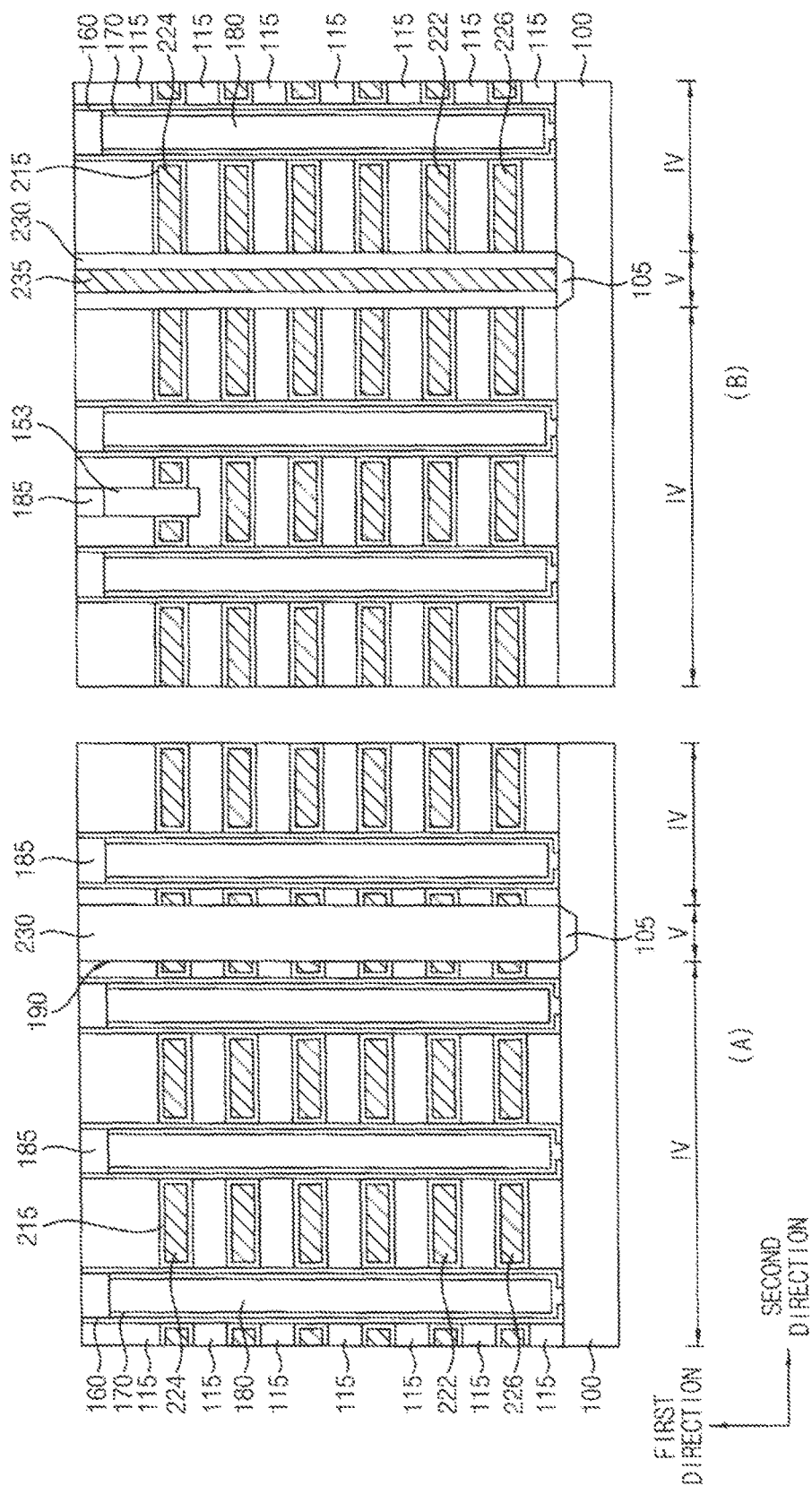

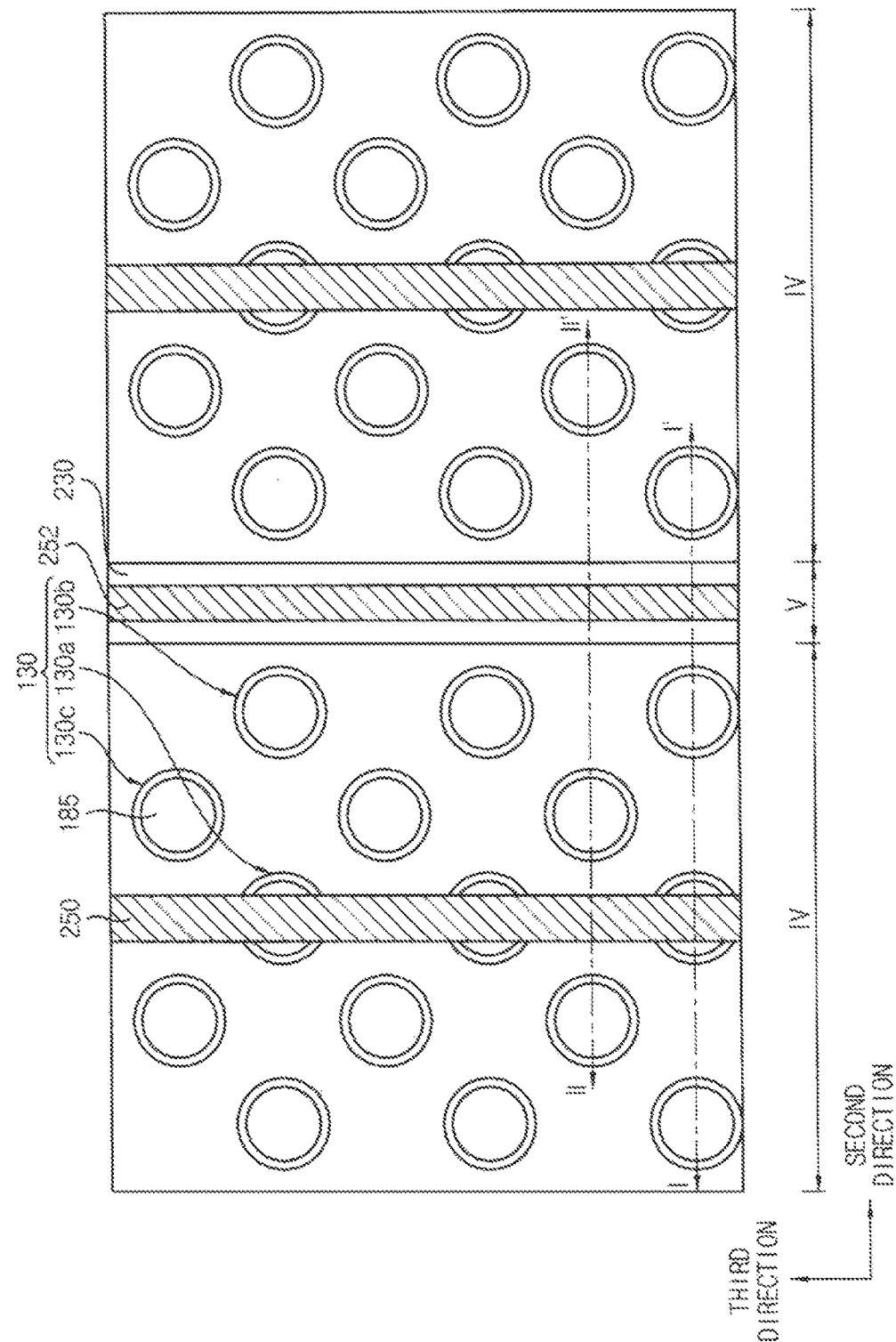

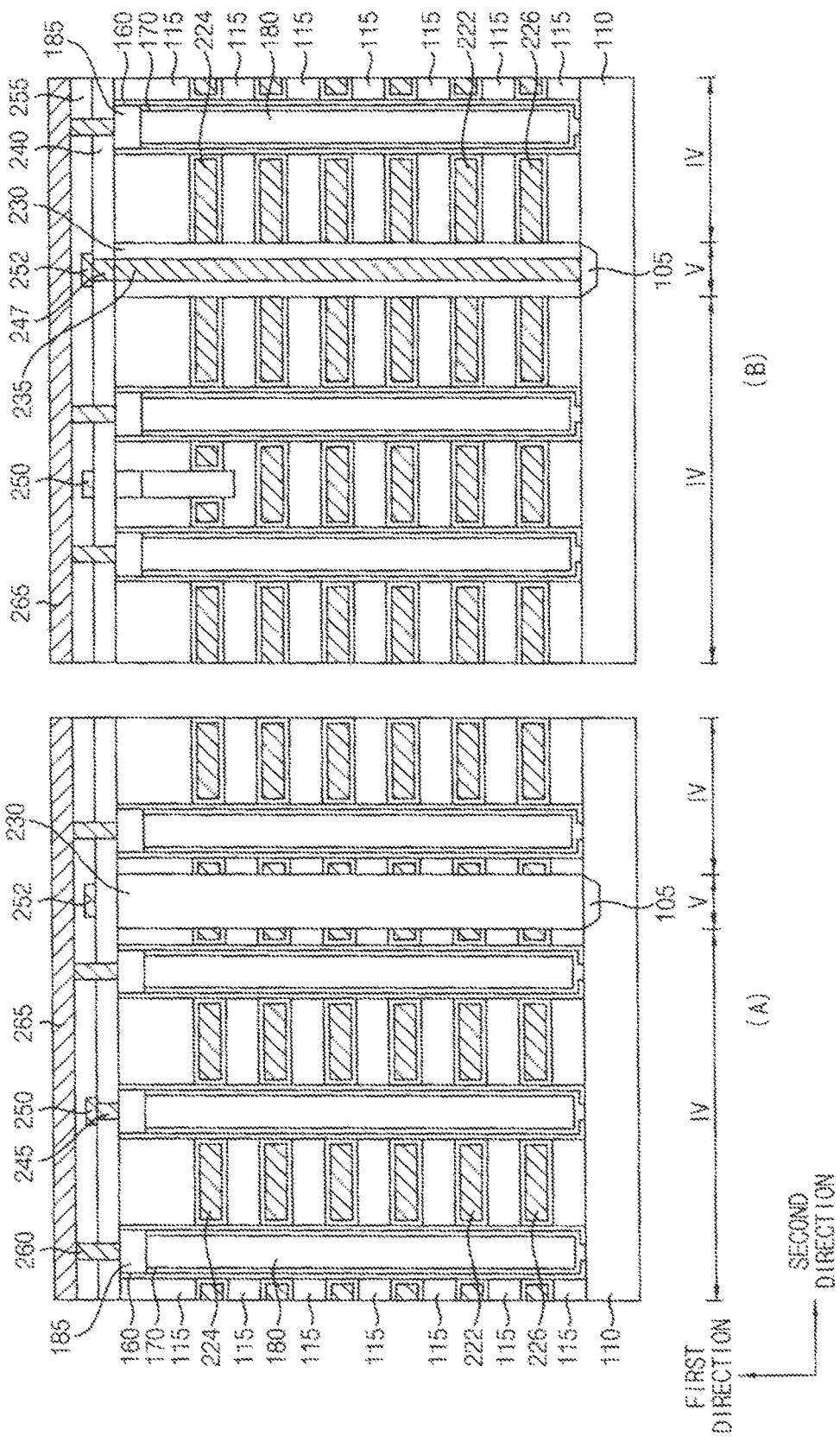

VERTICAL MEMORY DEVICES WITH VERTICAL ISOLATION STRUCTURES AND METHODS OF FABRICATING THE SAME

CROSS-REFERENCE TO RELATED APPLICATIONS

This application is a continuation of U.S. patent application Ser. No. 14/191,568, filed on Feb. 27, 2014 and claims the benefit of Korean Patent Application No. 10-2013-0027397, filed on Mar. 14, 2013 in the Korean Intellectual Property Office (KIPO), the contents of which are hereby incorporated herein in their entireties by reference.

BACKGROUND

Example embodiments relate to memory devices and methods of manufacturing the same and, more particularly, to vertical memory devices having vertical channels and methods of manufacturing the same.

In some methods of manufacturing vertical memory devices, an insulation layer and a sacrificial layer may be alternately and repeatedly formed on a substrate. Holes are formed though the insulation layers and the sacrificial layers. Channels are formed to fill the holes. Openings are formed through the insulation layers and the sacrificial layers. The sacrificial layers exposed by the openings are removed to form gaps exposing the channels. ONO layers and gate structures including gate electrodes are formed to fill the gaps.

Dummy channels are disposed in a region where the gate electrodes (particularly, a string selection line) are separated. However, a coupling phenomenon may occur between the channel and the dummy channel, so that the electrical characteristics of the vertical memory device may degrade.

SUMMARY

Some embodiments provide a vertical memory device including a substrate, a column of vertical channels on the substrate and spaced apart along a first direction parallel to the substrate, respective charge storage structures on sidewalls of respective ones of the vertical channels and gate electrodes vertically spaced along the charge storage structures. The vertical memory device further includes an isolation pattern disposed adjacent the column of vertical channels and including vertical extension portions extending parallel to the vertical channels and connection portions extending between adjacent ones of the vertical extension portions.

In some embodiments, the gate electrodes may include a ground selection line, a word line and a string selection line vertically spaced apart along the vertical channels. The connection portions may have bottom surfaces disposed between the string selection line and the word line. The bottom surfaces of the connection portions may be disposed lower than a bottom surface of the string selection line and top surfaces of the connection portions may be disposed higher than a top surface of the string selection line. In some embodiments, the string selection line may include string selection lines separated from each other along a second direction parallel to the substrate by the isolation pattern.

In some embodiments, the vertical extension portions may include pillars having a diameter substantially same as an outer diameter of the charge storage structures. The vertical extension portions may have a height substantially same as a height of the charge storage structures.

The vertical memory device may further include respective conductive pads disposed on the vertical channels and the isolation pattern. Bottom surfaces of the conductive pads may be substantially higher than a top surface of the string selection line.

In some embodiments, the vertical memory device may further include respective semiconductor patterns disposed between the vertical extension portions and the substrate and between the charge storage structures and the substrate.

Some embodiments provide a vertical memory device including a substrate and adjacent first and second columns of vertical channels, the vertical channels in each of the first and second columns spaced apart along a first direction parallel to the substrate. The vertical memory device further includes respective charge storage structures on sidewalls of the vertical channels of the first and second columns of vertical channels and gate electrodes vertically spaced along sidewalls of the charge storage structures. A wiring extends along the first direction on and electrically connected to a vertical channel of the first column of vertical channels. A bit line extends in a second direction substantially perpendicular to the first direction on and electrically connected to a vertical channel of the second column of vertical channels. The bit line may cross the wiring over a vertical channel of the first column of vertical channels.

In some embodiments, the vertical memory device may further include isolation patterns extending between adjacent ones of the charge storage structures on the first column of vertical channels. The gate electrodes may include a ground selection line, a word line and a string selection line vertically spaced apart along the vertical channels. The isolation patterns may have bottom surfaces disposed between the string selection line and the word line. The bottom surfaces of the isolation patterns may be disposed lower than a bottom surface of the string selection line, and top surfaces of the isolation patterns may be disposed higher than a top surface of the string selection line.

Still further embodiments provide methods of fabricating a vertical memory device. The methods include alternately forming first insulation layers and first sacrificial layers on a substrate and forming holes through the first insulation layers and first sacrificial layers to exposed portions of the substrate, the holes including first and second columns of holes extending along a first direction parallel to the substrate. The methods further include forming a trench extending along the first direction through the first column of holes and forming an isolation pattern in the trench and the first column of holes. A charge storage structure and a vertical channel are formed in each of the holes of the second column of holes. The first sacrificial layers are removed to form gaps exposing a sidewall of the charge storage structure and gate electrodes are formed in the gaps.

BRIEF DESCRIPTION OF THE DRAWINGS

Example embodiments will be more clearly understood from the following detailed description taken in conjunction with the accompanying drawings. FIGS. 1 to 28B represent non-limiting, example embodiments as described herein.

FIG. 1 is a perspective view illustrating a vertical memory device in accordance with example embodiments;

FIG. 2a is a horizontal cross-sectional view cut along the line III-III' in FIG. 1;

FIG. 2b includes a vertical cross-sectional view (A) cut along the line I-I' in FIG. 2a and a vertical cross-sectional view (B) cut along the line II-II' in FIG. 2a;

FIG. 3 is a local perspective view illustrating the vertical memory device of FIG. 1;

FIG. 4 is a perspective view illustrating an isolation pattern in accordance with example embodiments;

FIG. 5 is an equivalent circuit diagram illustrating a vertical memory device in accordance with example embodiments;

FIGS. 6 to 16B are vertical cross-sectional views, horizontal cross-sectional views and perspective views illustrating operations for manufacturing a vertical memory device in accordance with example embodiments;

FIG. 17 is a perspective view illustrating a vertical memory device in accordance with other example embodiments;

FIG. 18 includes a vertical cross-sectional view (A) cut along the line I-I' in FIG. 17 and a vertical cross-sectional view (B) cut along the line II-II' in FIG. 17;

FIG. 19 is a perspective view illustrating a vertical memory device in accordance with other example embodiments;

FIG. 20 includes a vertical cross-sectional view (A) cut along the line I-I' in FIG. 19 and a vertical cross-sectional view (B) cut along the line II-II' in FIG. 19;

FIG. 21 is a plan view illustrating a vertical memory device in accordance with other example embodiments;

FIG. 22 includes a vertical cross-sectional view (A) cut along the line I-I' in FIG. 21 and a vertical cross-sectional view (B) cut along the line II-II' in FIG. 21; and FIGS. 23A to 28B are vertical cross-sectional views and horizontal cross-sectional views illustrating operations for manufacturing a vertical memory device in accordance with other example embodiments.

DETAILED DESCRIPTION

Figure 1:
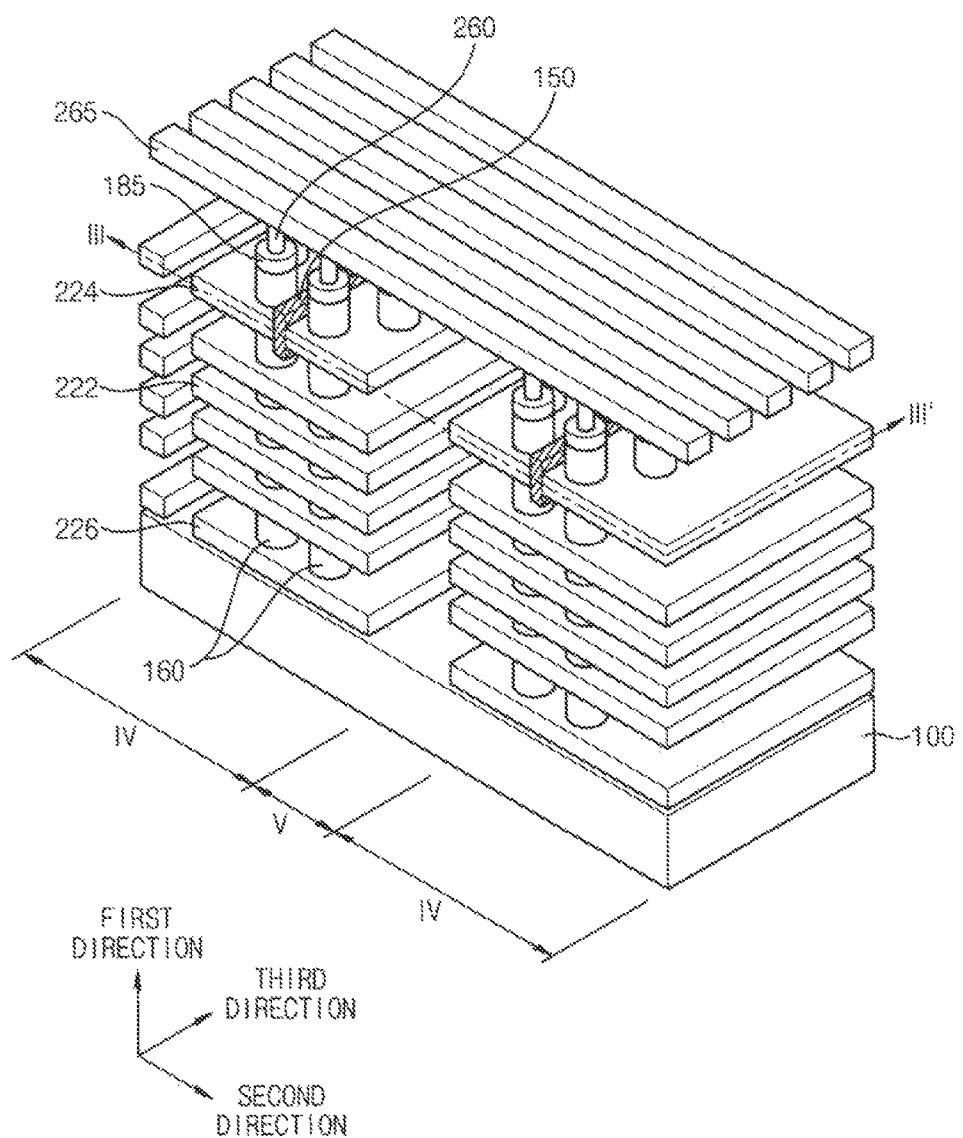

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2B:
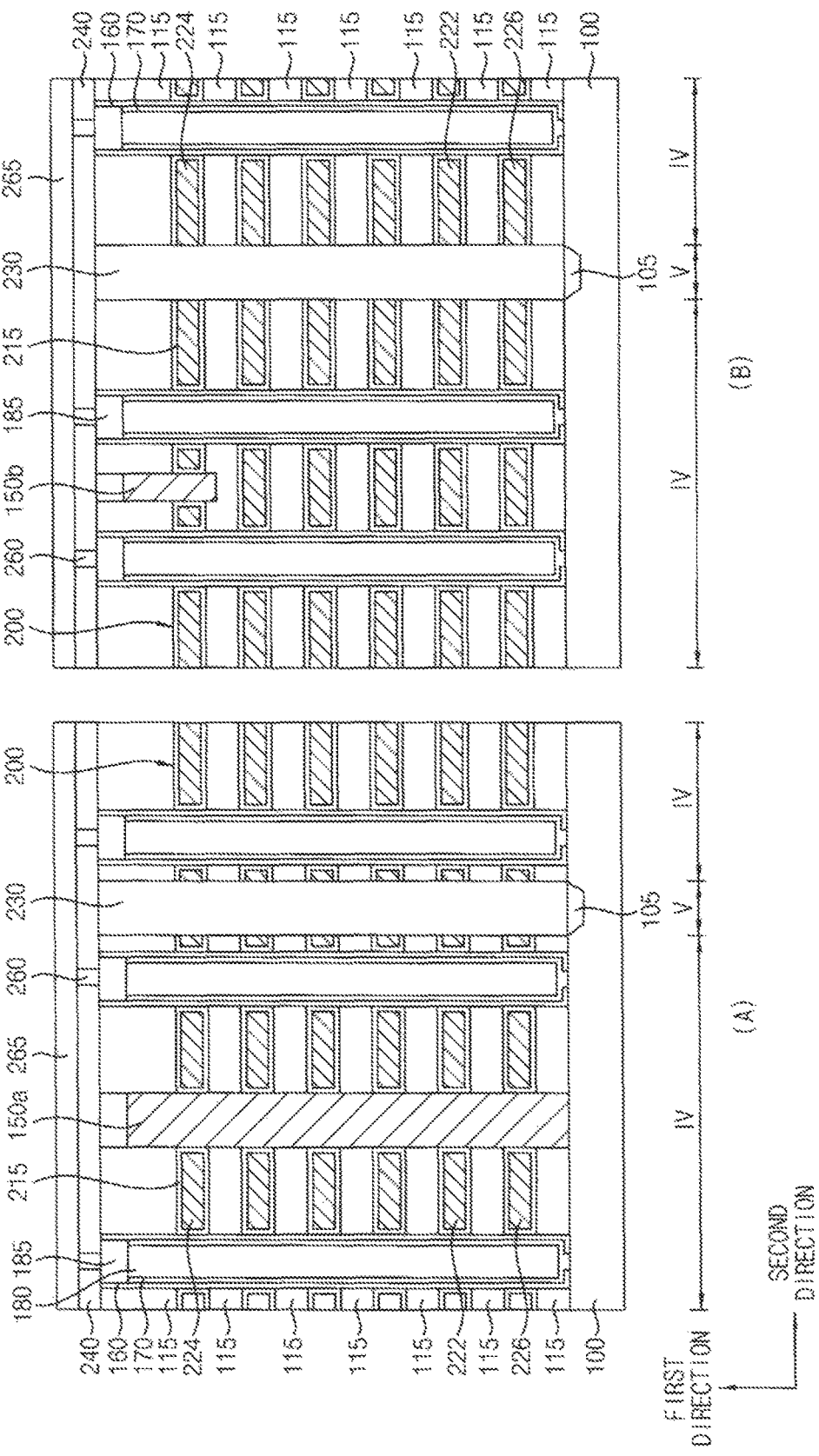
Figure 3:
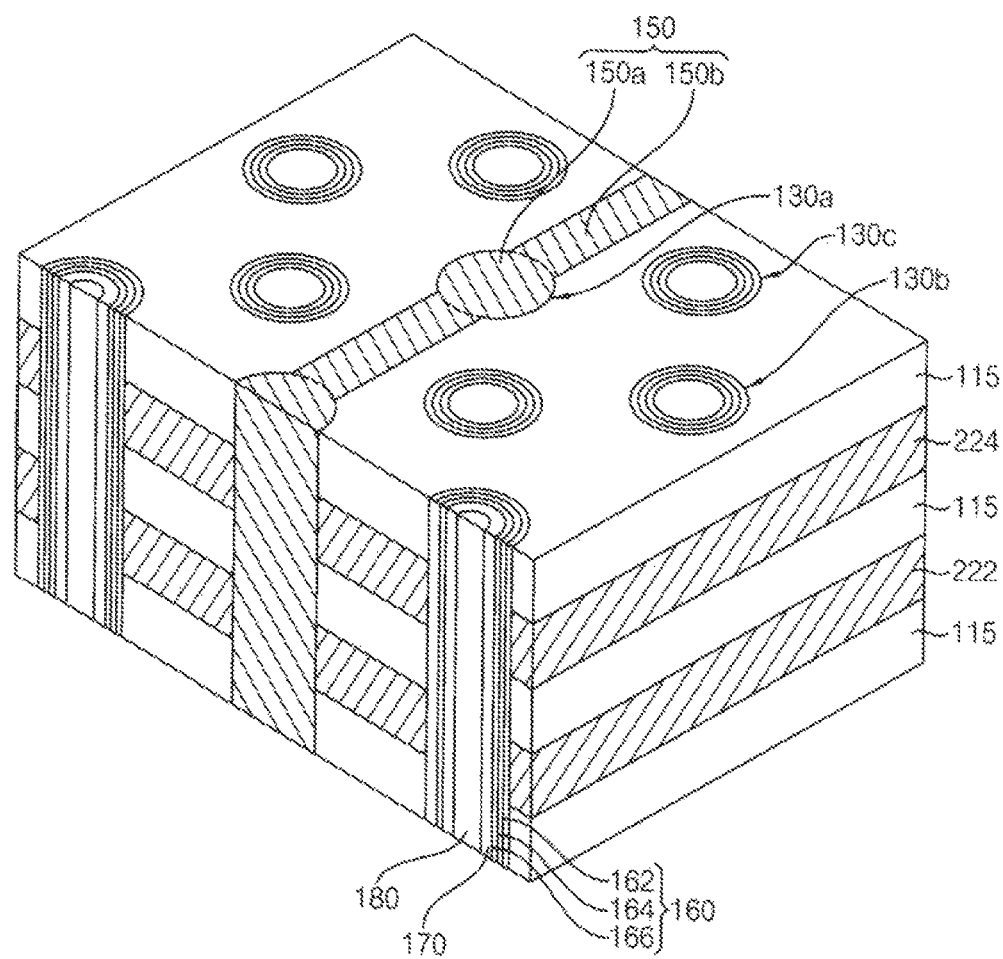
Figure 4:
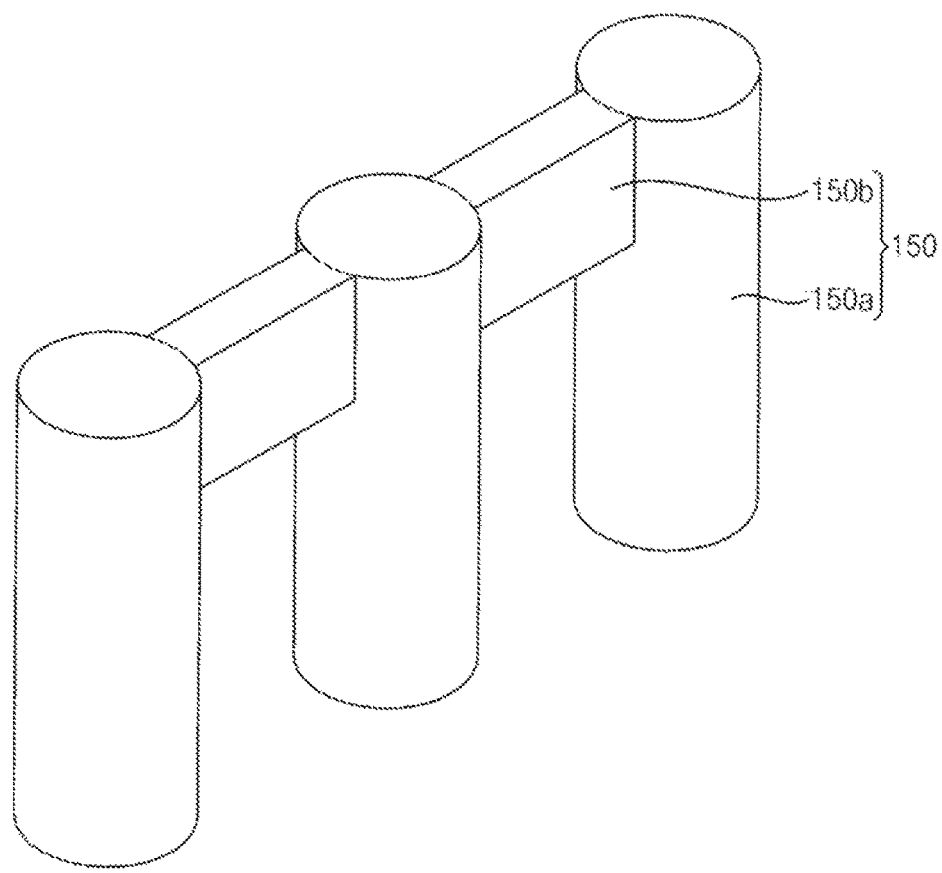

FIG. 1 is a perspective view illustrating a vertical memory device in accordance with example embodiments; FIG. 2a is a horizontal cross-sectional view cut along the line III-III' in FIG. 1 illustrating the vertical memory device; FIG. 2b includes a vertical cross-sectional view (A) cut along the line I-I' in FIG. 2a and a vertical cross-sectional view (B) cut along the line II-II' in FIG. 2a illustrating the vertical memory device; FIG. 3 is a local perspective view illustrating the vertical memory device; and FIG. 4 is a perspective view illustrating an isolation pattern in accordance with example embodiments.

For the convenience of the explanation, FIG. 1 does not show all elements of the vertical memory device, but only shows some elements thereof, e.g., a substrate, a semiconductor pattern, a channel, a gate electrode, a pad, an isolation pattern, a bit line contact and a bit line. In all figures in this specification, a direction substantially perpendicular to a top surface of the substrate is referred to as a first direction, and two directions substantially parallel to the top surface of the substrate and substantially perpendicular to each other are referred to as a second direction and a third direction. Additionally, a direction indicated by an arrow in the figures and a reverse direction thereto are considered as the same direction.

Referring to FIGS. 1 to 4, the vertical memory device may include a plurality of channels 170 each of which may extend in the first direction on a substrate 100, a charge storage structure 160 surrounding an outer sidewall of each channel 170 and a second blocking layer pattern 215 that may be stacked on and may partially surround the outer sidewall of each channel 170.

Additionally, the vertical memory device may include a plurality of gate electrodes 222, 224 and 226 that may be formed on an outer sidewall of the second blocking layer pattern 215 and partially cover outer sidewalls of some channels 170. The gate electrodes 222, 224 and 226 may be separated by a first insulation layer pattern 115, a third insulation layer pattern 230 and an isolation pattern 150. Further, the vertical memory device may further include a bit line 265 that may be electrically connected to the channels 170.

The substrate 10Q may include a semiconductor material, e.g., silicon, germanium, etc. The substrate 100 may include a first region IV and a second region V. In some example embodiments, the first region IV may be a cell region where the channel 170 may be disposed, and the second region V may be a word line cut region that may separate the gate electrodes 222, 224 and 226. A plurality of first regions IV may be arranged in the second direction, and each of the first regions IV may extend in the third direction. The second region V may be arranged between the first regions IV, and the second region V may extend in the third direction.

Each channel 170 may extend in the first direction in the first region IV. In some example embodiments, each channel 170 may have a cup shape of which a central bottom is opened. In this case, a space defined by an inner wall of each channel 170 may be filled with a second insulation layer pattern 180. In other example embodiments, each channel 170 may have a pillar shape. For example, the channels 170 may include doped or undoped polysilicon or single crystalline silicon.

In some example embodiments, the plurality of channels 170 may be arranged in both of the second and third directions, and thus a channel array may be defined.

In some example embodiments, the channel array may be arranged to correspond to a hole array (see FIG. 7A). In some example embodiments, the channels 170 may not be disposed in the first holes 130a (see FIG. 7A) arranged at a central portion of the first region IV in the third direction, and the channels 170 may be disposed in the second holes 130b and the third holes 130c (see FIG. 7A) arranged at edge portions of the first region IV in the third direction. Therefore, the plurality of channels 170 may be arranged in a zigzag pattern (that is, a staggered pattern) with respect to the third direction, and thus more channels 170 may be arranged in a given area.

Referring to FIG. 3, the charge storage structure 160 may include a tunnel insulation layer pattern 166, a charge storage layer pattern 164 and a first blocking layer pattern 162 that may be sequentially stacked on and may surround the outer sidewalls of each channel 170. Particularly, the tunnel insulation layer pattern 166, the charge storage layer pattern 164 and the first blocking layer pattern 162 may surround the outer sidewall and a bottom surface of each channel 170. In some example embodiments, a plurality of charge storage structures 160 may be formed, each of which may be corresponded to each channel 170.

In some example embodiments, the tunnel insulation layer pattern 166 may include an oxide, e.g., silicon oxide, the charge storage layer pattern 164 may include a nitride, e.g., silicon nitride, and the first blocking layer pattern 162 may include an oxide, e.g., silicon oxide.

In some example embodiments, each channel 170 may be disposed through the charge storage structure 160 to contact a top surface of the substrate 100.

Additionally, a pad 185 may be formed on top surfaces of the channel 170 and the charge storage structure 160. In some example embodiments, the pad 185 may include doped or undoped polysilicon or single crystalline silicon.

A plurality of first insulation layer patterns 115 may be formed in the first direction on sidewalls of the first blocking layer patterns 162, respectively. For example, each first insulation layer pattern 115 may include silicon oxide, and a space between the first insulation layer patterns 115 at each level may be defined as a gap 200.

The second blocking layer pattern 215 may surround a sidewall of the first blocking layer pattern 162 exposed by the gap 200. Thus, portions of the outer sidewalls of the channels 170 may be surrounded by the second blocking layer pattern 215. The second blocking layer pattern 215 may be further formed on an inner wall of the gap 200. Top and bottom end portions of the second blocking layer pattern 215 may extend in both of the second and third directions. The second blocking layer pattern 215 may include an insulation material, e.g., aluminum oxide and/or silicon oxide.

The plurality of gate electrodes 222, 224 and 226 may be formed on sidewalls of the second blocking layer pattern 215 and may fill the gap 200. In some example embodiments, the plurality of gate electrodes 222, 224 and 226 may extend in the third direction.

The plurality of gate electrodes 222, 224 and 226 may include a ground selection line (GSL) 226, a word line 222 and a string selection line (SSL) 224 that are spaced apart from each other along the first direction.

Each of the GSL 226, the word line 222 and the SSL 224 may be at a single level (e.g., one of each, each at a different height) or more than one level, and each of the first insulation layer patterns 115 may be interposed therebetween. In an example embodiments, the GSL 226 and the SSL 224 may be at one level (e.g., two of each at different heights), respectively, and the word line 222 may be at 4 levels between the GSL 226 and the SSL 217. However, the GSL 226 and the SSL 224 may be at two levels, and the word line 222 may be formed at 2, 8 or 16 levels.

In some example embodiments, the plurality of gate electrodes 222, 224 and 226 may include, for example, a metal and/or a metal nitride. For example, the plurality of gate electrodes 222, 224 and 226 may include a metal and/or a metal nitride with low electrical resistance (e.g., tungsten, tungsten nitride, titanium, titanium nitride, tantalum, tantalum nitride and/or platinum.).

Accordingly, the charge storage structure 160 and the plurality of gate electrodes 222, 224 and 226 may define a gate structure. A plurality of gate structures may be formed in the first direction.

On the other hand, the plurality of gate electrodes 222, 224 and 226 may be arranged in the second direction. Particularly, the plurality of gate electrodes 222, 224 and 226 may be separated by the third insulation layer pattern 230 and the isolation pattern 150 extending in the third direction.

The third insulation layer pattern 230 may be disposed in the second region V of the substrate 100, and may extend in the first direction and the third direction. Therefore, the word line 222, the SSL 224 and the GSL 226 may be separated from each other in the second direction by the third insulation layer pattern 230.

Referring to FIG. 3 and FIG. 4, the isolation pattern 150 may be disposed at the central portion of the first region IV of the substrate 100. The isolation pattern 150 may include a plurality of extension portions 150*a* extending in the first direction and a plurality of connection portions 150*b* connecting the extension portions 150*a* in the third direction.

In some example embodiments, the plurality of extension portions 150*a* may be arranged in the third direction, and each of the extension portions 150*a* may extend in the first direction. Therefore, a bottom surface of the extension portions 150*a* may directly contact the surface of the substrate 100, and a top surface of the extension portions 150*a* may be substantially higher than a top surface of the SSL 224. For example, the extension portions 150*a* may have a pillar shape.

The connection portions 150*b* may be disposed between the extension portions 150*a* in the third direction. The connection portions 150*b* may be disposed through the SSL 224, so that the SSL 224 may be separated from each other in the second direction by the connection portions 150*b*. The connection portions 150*b* may not penetrate the word line 222. Accordingly, the connection portions 150*b* may separate the SSL 224 in the second direction, and may not separate the word line 222.

A bottom surface of the connection portions 150*b* may be substantially equal to or lower than a bottom surface of the SSL 224, and may be higher than a top surface of the uppermost word line 222. The bottom surface of the connection portion 150*b* may be higher than the bottom surface of the extension portion 150*a*. Further, a top surface of the connection portions 150*b* may substantially equal to the top surface of the extension portions 150*a*. A width of the connection portion 150*b* in the second direction may be substantially smaller than a diameter of the extension portion 150*a*.

In some example embodiments, the isolation pattern 150 may include an insulation material, such as silicon oxide. In particular, the isolation pattern 150 may consist essentially of an insulation material. Therefore, the extension portions 150*a* of the isolation pattern 150 may reduce or prevent a coupling between the isolation pattern 150 and the adjacent channels 170.

The bit line 265 may be electrically connected to the pad 185 via a bit line contact 235, and thus may be electrically connected to the channels 170. The bit line 265 may include a metal, a metal nitride, doped polysilicon, and the like. In some example embodiments, the bit line 265 may extend in the second direction, and a plurality of bit lines 265 may be formed in the third direction.

The bit line contact 260 may be disposed through a fourth insulation layer 240, and make contact with a top surface of the pad 185. The bit line contact 260 may include a metal, a metal nitride, doped polysilicon, and the like.

According to example embodiments, the vertical memory device may include the isolation pattern 150. The isolation pattern 150 may include an insulation material such as silicon oxide. Therefore, coupling between the extension portions 150*a* and the adjacent channels 170 may be reduced or prevented. Further, the connection portions 150*b* may separate the SSL 224 in the second direction.

Figure 5:
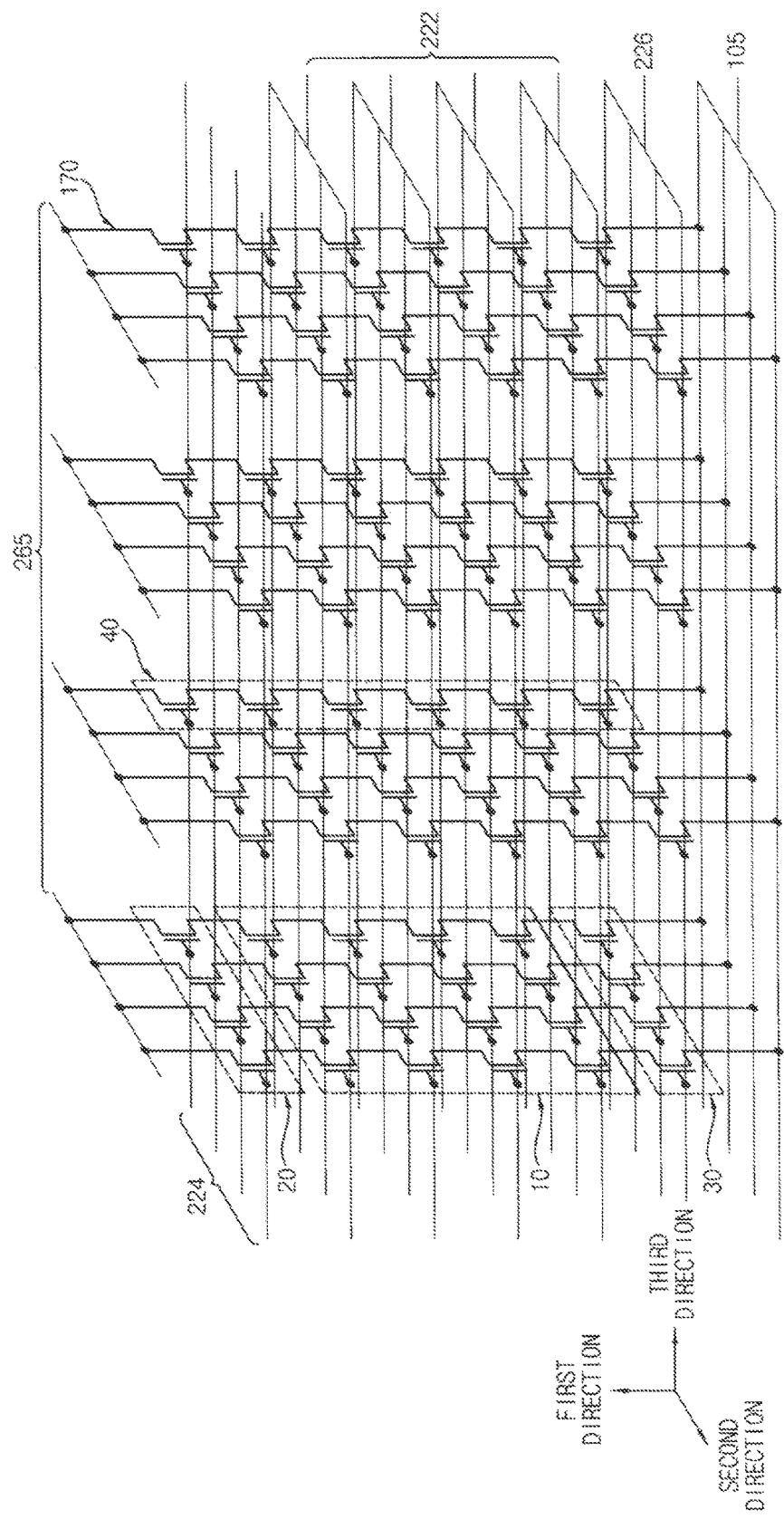

FIG. 5 is an equivalent circuit diagram illustrating a vertical memory device in accordance with example embodiments.

Referring to FIG. 5 with the FIGS. 1 to 4, the word line 222 and the channels 170 according to example embodiments may define a memory cell 10. The SSL 224 and the channels 170 may define an upper non memory cell 20, and the GSL 226 and the channels 170 may define a lower non memory cell 30.

A single cell string 40 may be formed to include the upper non memory cell 20, the lower non memory cell 30 and a plurality of memory cells 10. Each cell string 40 may be electrically connected to the bit line 265.

The equivalent circuit diagram in the FIG. 5 may be applied not only to the vertical memory device illustrated with reference to the FIGS. 1 to 4 but also to all vertical memory devices illustrated in all of the example embodiments.

The plurality of word lines 222 may extend in the third direction, and may be spaced apart from each other in the first and second directions. Thus, the plurality of memory cells 10 defined by the word lines 222 and the channels 170 may be distributed three-dimensionally.

A plurality of SSLs 224 may extend in the third direction, and may be arranged in the second direction. Thus, one of the cell strings 40 connected to one bit line 265 may be selected by the upper non memory cell 20 including the SSL 224. The GSL 226 may control an electrical connection between the channel 170 and the substrate 100.

FIGS. 6 to 16B are vertical cross-sectional views, horizontal cross-sectional views and perspective views illustrating operations for manufacturing a vertical memory device in accordance with example embodiments. FIGS. 7A, 8A, 9A, 10A, 11A, 12A, 13A and 16A are horizontal cross-sectional views illustrating operations for manufacturing a vertical memory device in accordance with example embodiments, FIGS. 6, 7B, 8B, 9B, 10B, 11B, 12B, 13B, 14, 15 and 16B are vertical cross-sectional views illustrating operations for manufacturing a vertical memory device in accordance with example embodiments, and FIG. 11C is a local perspective view illustrating operations for manufacturing the vertical memory device. Particularly, FIGS. 6, 7B, 8B, 9B, 10B, 11B, 12B, 13B, 14, 15 and 16B include cross-sectional views (A) cut along the line I-I' of the horizontal cross-sectional views and cross-sectional views (B) cut along the line II-II' of the horizontal cross-sectional views. The figures show operations for manufacturing the vertical memory device of FIGS. 1 to 4, but these operations are not be limited thereto.

Figure 6:
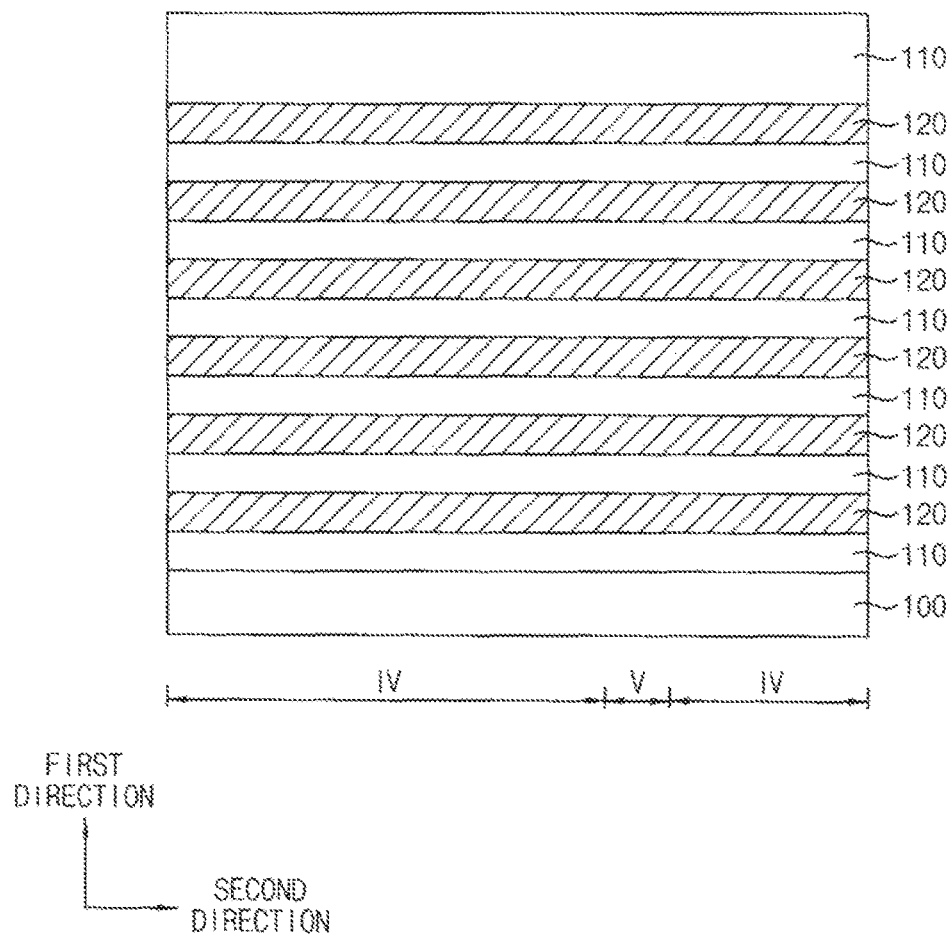

Referring to FIG. 6, first insulation layers 110 and first sacrificial layers 120 may be alternately and repeatedly formed on a substrate 100. A plurality of first insulation layers 110 and a plurality of first sacrificial layers 120 may be alternately formed on each other at a plurality of levels, respectively.

The substrate 100 may include a semiconductor material, for example, silicon and/or germanium. The substrate 100 may be divided into a first region IV and a second region V. In some example embodiments, the first region IV may be a cell region where the channel 170 (see FIG. 11A) may be disposed, and the second region V may be a word line cut region that may separate the gate electrodes 222, 224 and 226 (see FIG. 15).

In some example embodiments, the first insulation layers 110 and the first sacrificial layers 120 may be formed by, for example, a chemical vapor deposition (CVD) process, a plasma enhanced chemical vapor deposition (PECVD) process and/or an atomic layer deposition process (ALD) process. A lowermost first insulation layer 110, which may be disposed directly on a top surface of the substrate 100, may be formed by, for example, a thermal oxidation process. In some example embodiments, the first insulation layer 110 may include a silicon oxide. The first sacrificial layer 120 may be formed to include, for example, a material with etch selectivity to the first insulation layer 110 (e.g., silicon nitride).

Figure 15:
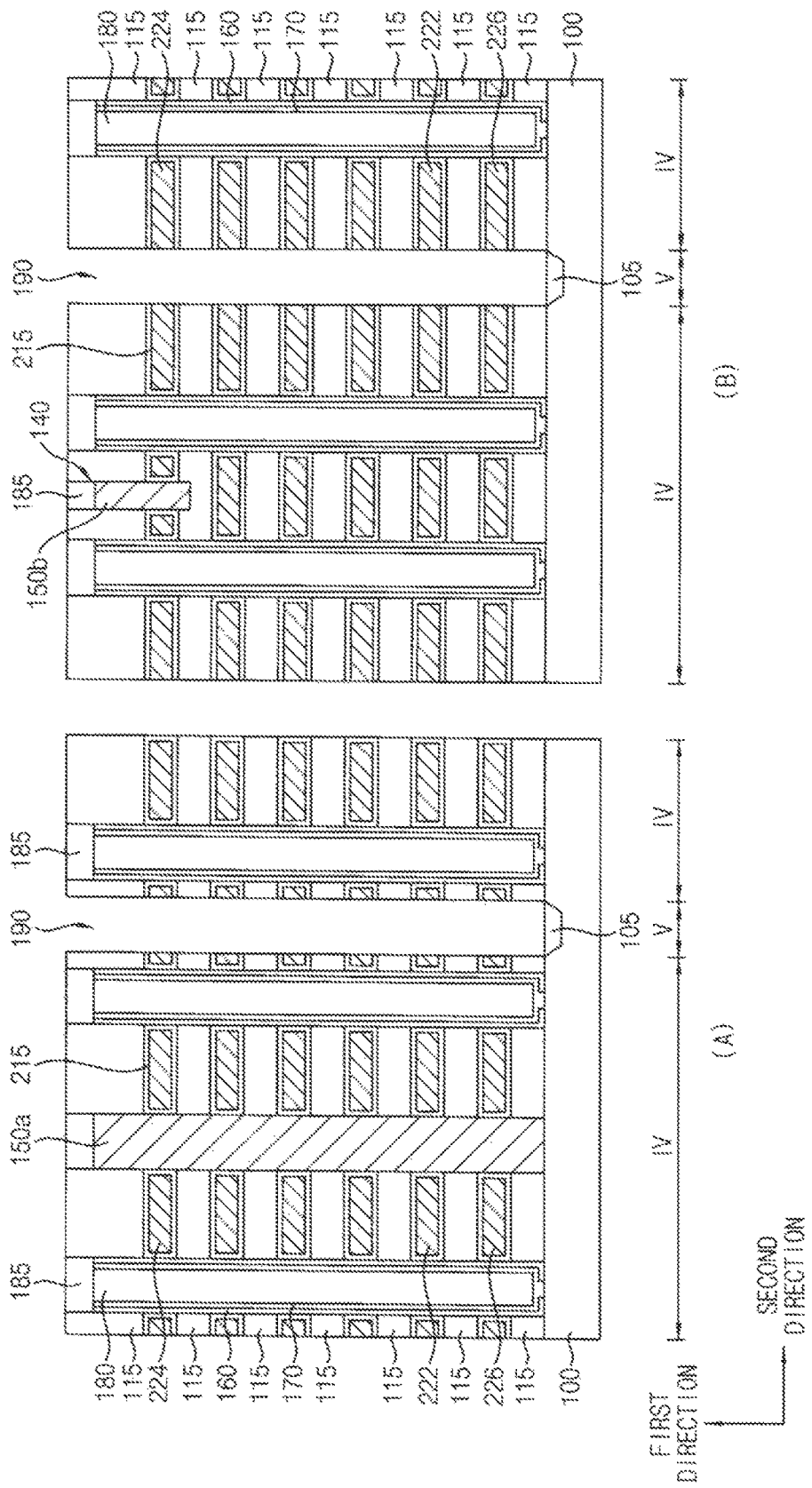

The number of the first insulation layers 110 and the number of the first sacrificial layers 120 stacked on the substrate 100 may vary according to the desired number of a GSL 226, a word line 222 and a SSL 224 (see FIG. 15). According to some example embodiments, each of the GSL 226 and the SSL 224 may be formed at a single level, and the word lines 222 may be formed at 4 levels. The first sacrificial layers 120 may be formed at 6 levels, and the first insulation layers 110 may be formed at 7 levels. According to some example embodiments, each of the GSLs 226 and the SSLs 224 may be formed at two levels, and the word lines 222 may be formed at 2, 8 or 16 levels. The number of the first insulation layers 110 and the number of the first sacrificial layers 120 may vary according to this case. However, the number of GSLs 226, SSLs 224 and word lines 222 may not be limited to the example embodiments described herein.

Referring to FIGS. 7A and 7B, a plurality of holes 130 may be formed through the first insulation layers 110 and the first sacrificial layers 120 to expose the top surface of the substrate 100. A second sacrificial layer pattern 135 may be formed in each hole 130.

In some example embodiments, after forming a hard mask on the uppermost first insulation layer 110, the first insulation layers 110 and the first sacrificial layers 120 may be dry etched using the hard mask as an etch mask to form the holes 130. A second sacrificial layer may be formed on the hard mask to fill the holes 130, and an upper portion of the second sacrificial layer may be removed to form the second sacrificial layer pattern 135.

Each of the holes 130 may extend in the first direction. Due to the characteristics of a dry etch process, the holes 130 may be of a width that becomes gradually decreases from a top portion to a bottom portion of the holes 130.

In some example embodiments, a plurality of holes 130a, 130b and 130c may be arrayed in the second and third directions in the first region IV. The holes 130a, 130b and 130c formed in the first region IV may define a hole array. In some example embodiments, the hole array may have a first hole column including the plurality of first holes 130a arranged in the third direction, a second hole column including the plurality of second holes 130b arranged in the third direction and a third hole column including the plurality of third holes 130c arranged between the first and second holes 130a and 130b. The first holes 130a may be arranged at a central portion of the first region IV in the third direction.

The second holes 130b may be arranged at edge portions of the first region IV in the third direction. The third holes 130c may be positioned in a direction, which may be an oblique angle to the second direction or the third direction, from the first or the second holes 130a or 130b. Accordingly, the first, second and third holes 130a, 130b and 130c may be arranged in a zigzag pattern with respect to the third direction, and thus more holes 130 may be arranged in a given area.

In some example embodiments, the second sacrificial layer may be formed using a material having an etch selectivity with respect to the first insulation layer 110 and the first sacrificial layer 120. When the first insulation layer 110 includes silicon oxide and the first sacrificial layer 120 includes silicon nitride, the second sacrificial layer may include polysilicon, amorphous silicon, a silicon based spin on hard mask (si-SOH) material or a carbon based spin on hard mask (c-SOH) material.

Figure 8B:
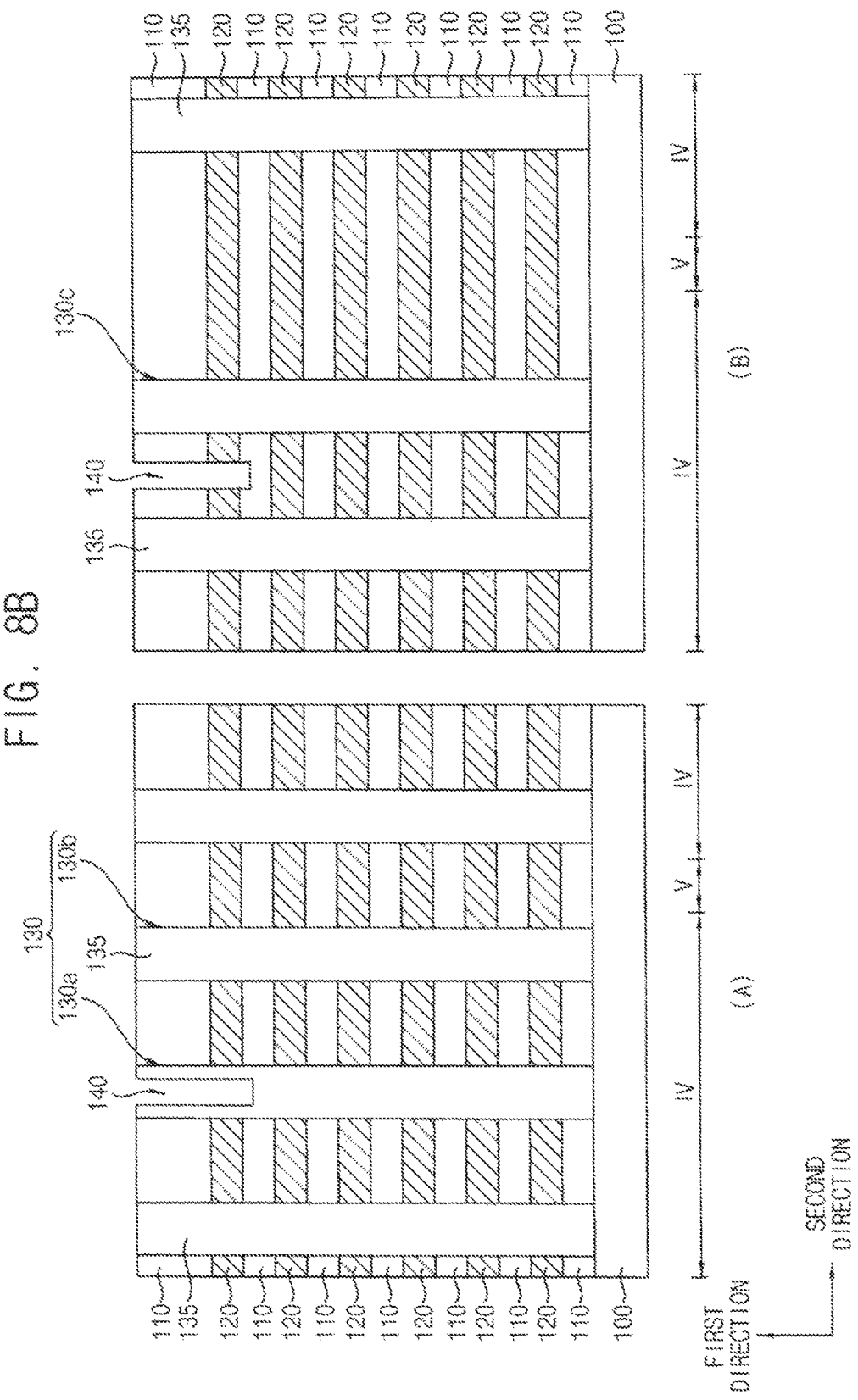

Referring to FIGS. 8A and 8B, a first trench 140 may be formed by partially removing the second sacrificial layer pattern 135 and portions of the first insulation layers 110 and the first sacrificial layers 120. The first trench 140 may penetrate a specific first sacrificial layer 120, in which the SSL 217 (see FIG. 15) may be subsequently formed, and the first insulation layer 110 disposed above the specific first sacrificial layer 120. Further, the first trench 140 may partially penetrate the first insulation layer 110 disposed under the specific first sacrificial layer 120, in which the SSL 217 may be subsequently formed.

In some example embodiments, the first trench 140 may extend in the third direction, and may overlap the second sacrificial layer pattern 135 disposed in the first hole 130a. Further, the first trench 140 may have a width in the second direction that may be less than a diameter of the first hole 130a.

Figure 9B:
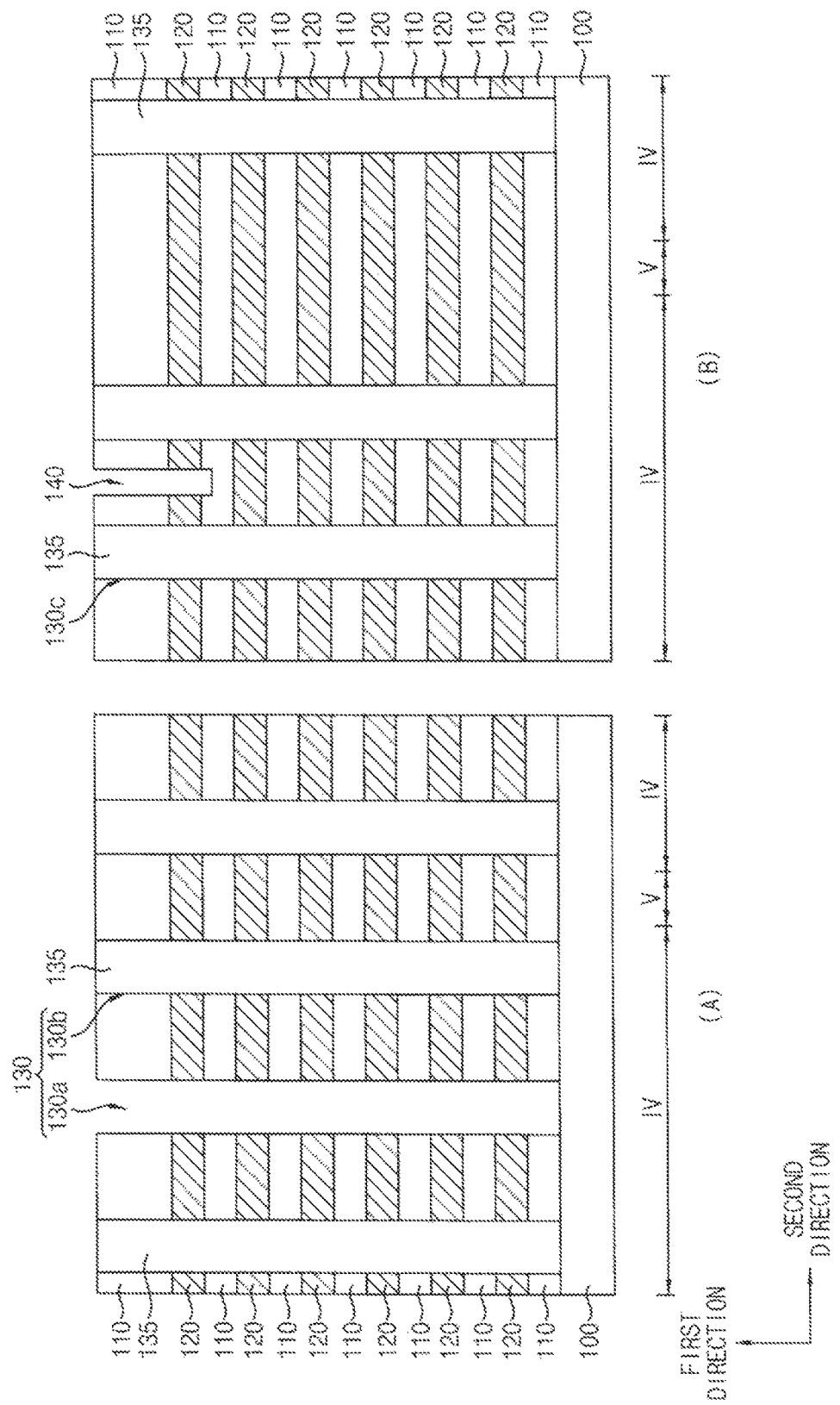

Referring to FIGS. 9a and 9b, the second sacrificial layer pattern 135 filling the first hole 130a may be removed. In some example embodiments, a mask may be formed on the first insulation layer 110 and the second sacrificial layer pattern disposed in the second and third holes 130b and 130c. An etching process may be performed to remove the second sacrificial layer pattern 135 filling the first hole 130a.

Therefore, the first holes 130a may be in fluid communication with the first trench 140. The first trench 140 may extend in the third direction, so that the plurality of first holes 130a arranged in the third direction may be in fluid communication with each other by the first trench 140.

Referring to FIGS. 10a and 10b, an isolation pattern 150 may be formed to fill the first holes 130a and the first trench 140. Particularly, after forming an isolation layer on the uppermost first insulation layer 110 to fill the first holes 130a and the first trench 140, an upper portion of the isolation layer may be planarized until a top surface of the first insulation layer 110 is exposed, thereby forming the isolation pattern 150. In some example embodiments, the isolation layer may be formed using a material having an etch selectivity with respect to the first insulation layer 110. The planarization process may include a chemical mechanical polishing (CMP) process and/or an etch back process.

The isolation pattern 150 may include a plurality of extension portions 150a filling the first holes 130a and a plurality of connection portions 150b connecting the extension portions 150a. In some example embodiments, the plurality of extension portions 150a may be arranged in the third direction. Each of the extension portions 150a may extend in the first direction according to the first holes 130a.

The extension portions 150a may directly contact the top surface of the substrate 100. The extension portion 150a may have a pillar shape.

The connection portions 150b may be disposed between the extension portions 150a in the third direction. The connection portions 150b may penetrate the specific first sacrificial layer 120, in which the SSL 217 (see FIG. 15) may be subsequently formed, and the first insulation layer 110 disposed above the specific first sacrificial layer 120. Further, the connection portions 150b may partially penetrate the first insulation layer 110 disposed under the specific first sacrificial layer 120, in which the SSL 217 may be subsequently formed. However, the connection portions 150b may not penetrate the first sacrificial layers 120, in which the word line 222 (see FIG. 15) may be subsequently formed. Therefore, a bottom surface of the connection portion 150b may be higher than a bottom surface of the extension portion 150a. Further, a width of the connection portion 150b in the second direction may be smaller than the diameter of the first extension portion 150a.

In some example embodiments, the isolation pattern 150 may include an insulation material, such as silicon oxide. Particularly, the isolation pattern 150 may consist essentially of an insulation material, that is, the isolation pattern 150 may not include a conductive material or a semiconductor material. The extension portions 150a of the isolation pattern 150 may reduce or prevent a coupling between the extension portions 150a and adjacent channels 170 (see FIG. 11A).

Figure 11A:
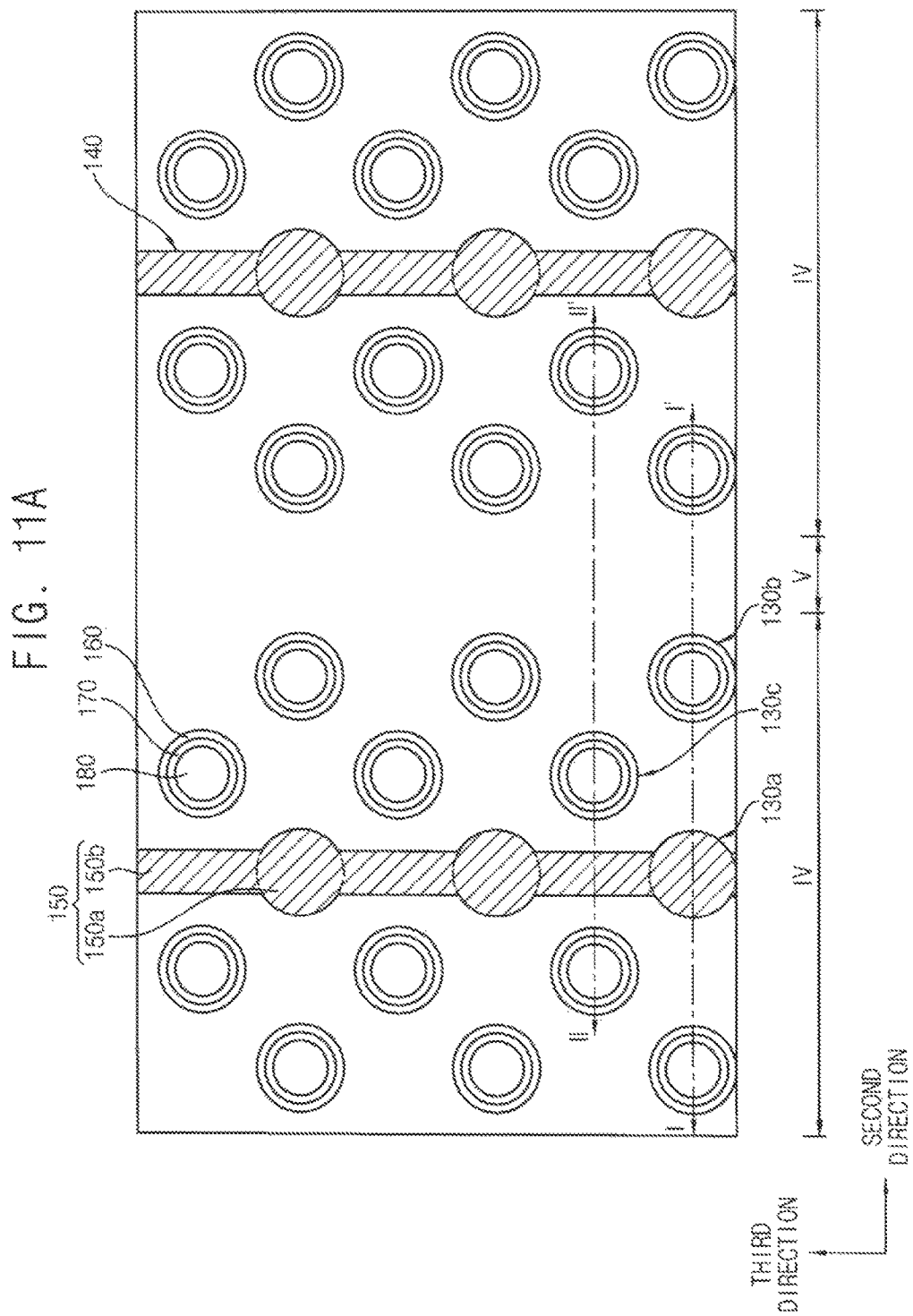
Figure 11C:
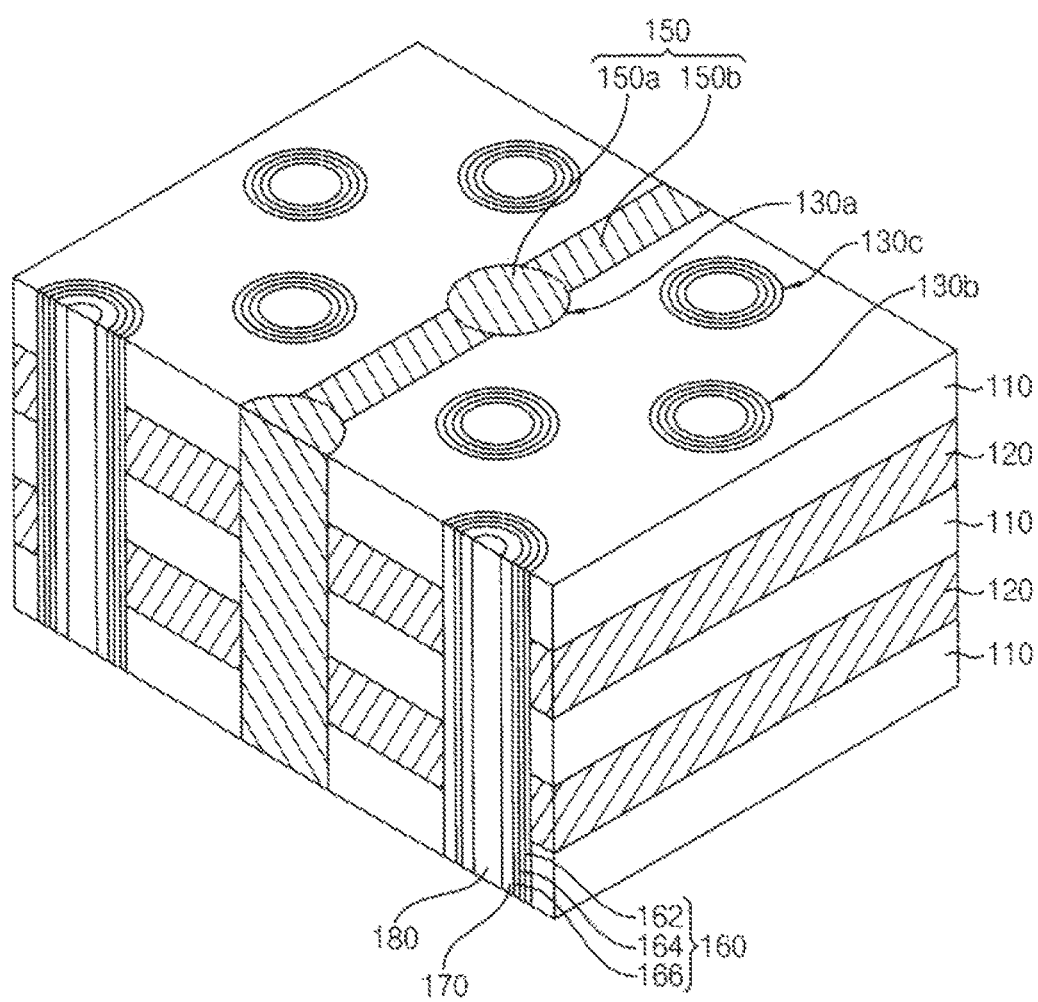

Referring to FIGS. 11A, 11B and 11C, after removing the second sacrificial layer pattern 135, a charge storage structure 160, a channel 170 and a second insulation layer pattern 180 may be formed in each of the second holes 130b and the third holes 130c. In some example embodiments, a first blocking layer, a charge storage layer and a tunnel insulation layer may be formed on inner walls of the second and third holes 130b and 130c, a top surface of the substrate 100 and the top surface of the uppermost first insulation layer 110, and lower portions of the first blocking layer, the charge storage layer and the tunnel insulation layer may be removed to form a first recess 175. A channel layer may be formed on inner walls of the first recess 175, the second hole 130b and the third hole 130c, a second insulation may be formed in the first recess 175, the second hole 130b and the third hole 130c, and an upper portion of the channel layer and the second insulation layer may be planarized until the top surface of the uppermost first insulation layer 110 is exposed, thereby forming a first blocking layer pattern 162, a charge storage layer pattern 164, a tunnel insulation layer pattern 166, the channel 170 and the second insulation layer pattern 180. The first blocking layer pattern 162, the charge storage layer pattern 164, the tunnel insulation layer pattern 166 may form the charge storage structure 160.

In some example embodiments, the first blocking layer may be formed using an oxide, e.g., silicon oxide, the charge storage layer may be formed using a nitride, e.g., silicon nitride, and the tunnel insulation layer may be formed using an oxide, e.g., silicon oxide.

In some example embodiments, a plurality of channels 170 may be arranged in the second and third directions, so that a channel array may be defined. The plurality of channels 170 in the second holes 130b and the plurality of channels 170 in the third holes 130c may be arranged in a zigzag pattern with respect to the third direction, and thus more channels 170 may be arranged in a given area.

Figure 12B:
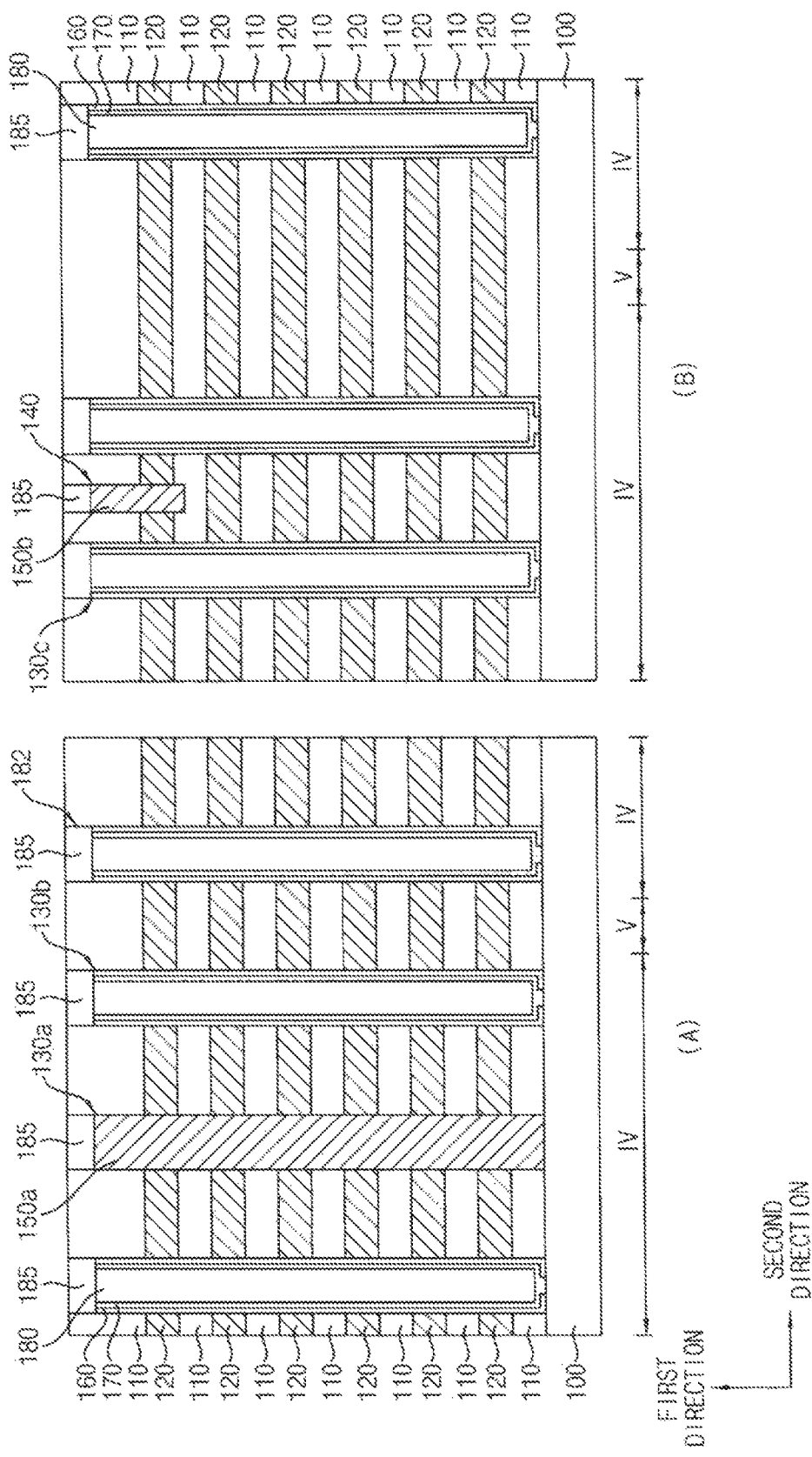

Referring to FIGS. 12A and 12B, upper portions of the channel 170, the charge storage structure 160, the second insulation layer pattern 180 and the isolation pattern 150 may be removed to form a second recess 182, and a pad 185 may be formed to fill the second recess 182. In particular, upper portions of the channel 170, the charge storage structure 160, the second insulation layer pattern 180 and the isolation pattern 150 may be removed by an etch back process to form the second recess 182. A pad layer may be formed on the channel 170, the charge storage structure 160, the second insulation layer pattern 180, the isolation pattern 150 and the uppermost first insulation layer 110 in the second recess 182, and the pad layer may be planarized until a top surface of the uppermost first insulation layer 110 is exposed to form the pad 185. In some example embodiments, the pad layer may include amorphous silicon, and a crystallization process may be further performed thereon.

Figure 13B:
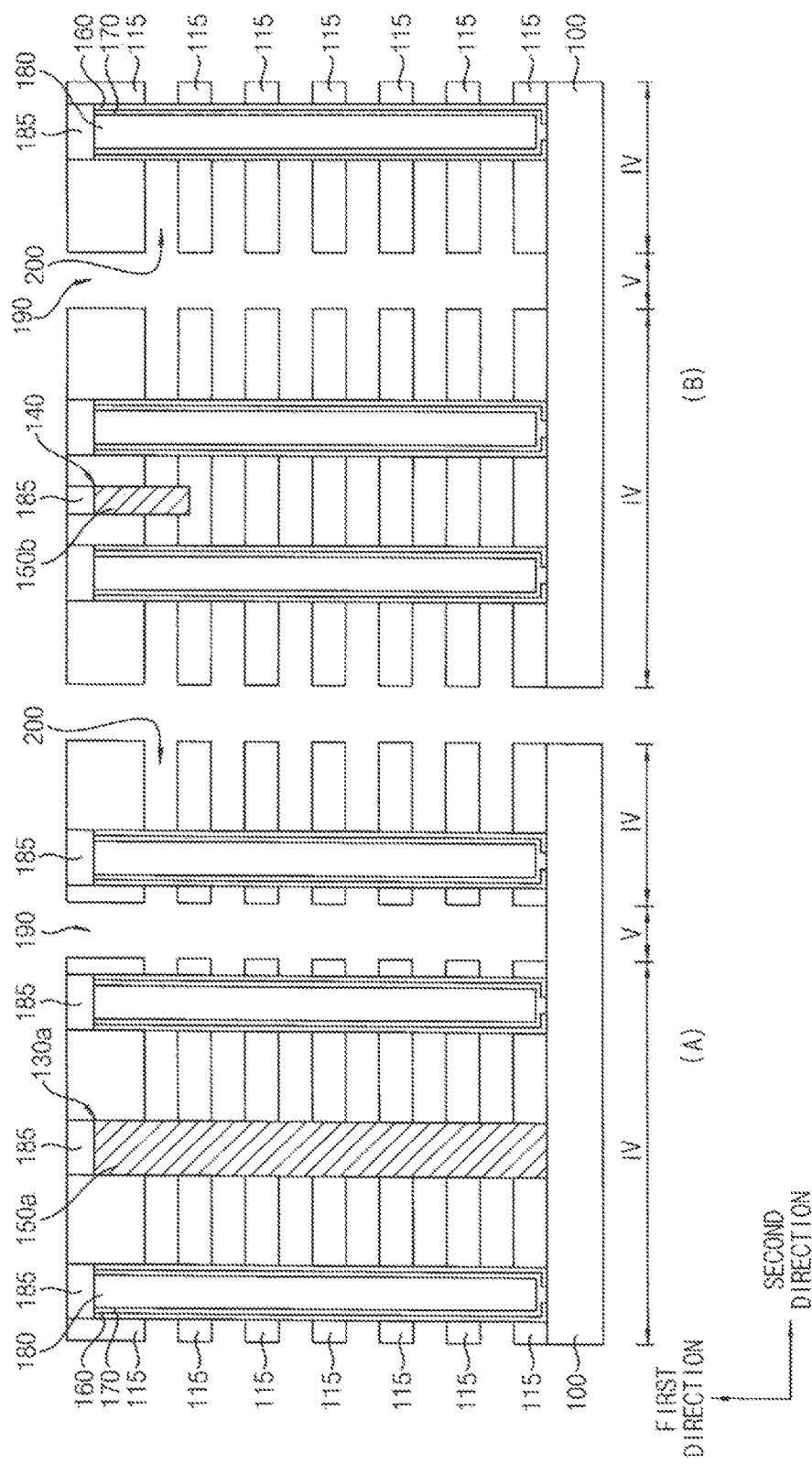

Referring to FIGS. 13A and 13B, a first opening 190 may be formed through the first insulation layers 110 and the first sacrificial layers 120 to expose the top surface of the substrate 100, and the first sacrificial layers 120 may be removed to form gaps 200 between first insulation layer patterns 115 at adjacent levels.

In some example embodiments, after forming a hard mask (not shown) on the uppermost first insulation layer 110, the insulation layers 110 and the first sacrificial layers 120 may be, for example, dry etched using the hard mask as an etch mask to form the first opening 190. The first opening 190 may extend in the first direction.

In some example embodiments, a plurality of first openings 190 may be arranged in the second direction, and each first opening 190 may extend in the third direction. Each first opening 190 may be formed in the second region V between the first regions IV.

The first insulation layer 110 and the first sacrificial layer 120 may be converted into a first insulation layer pattern 115 and a first sacrificial layer pattern 125, respectively. A plurality of first insulation layer patterns 115 may be formed in the second direction at each level, and each first insulation layer pattern 115 may extend in the third direction.

In some example embodiments, the first sacrificial layer patterns 125 exposed by the first openings 190 may be removed by, for example, a wet etch process using an etch solution including phosphoric acid and/or sulfuric acid. Therefore, an outer sidewall of the first blocking layer pattern 162 may be partially exposed by the gaps 200.

Figure 14:
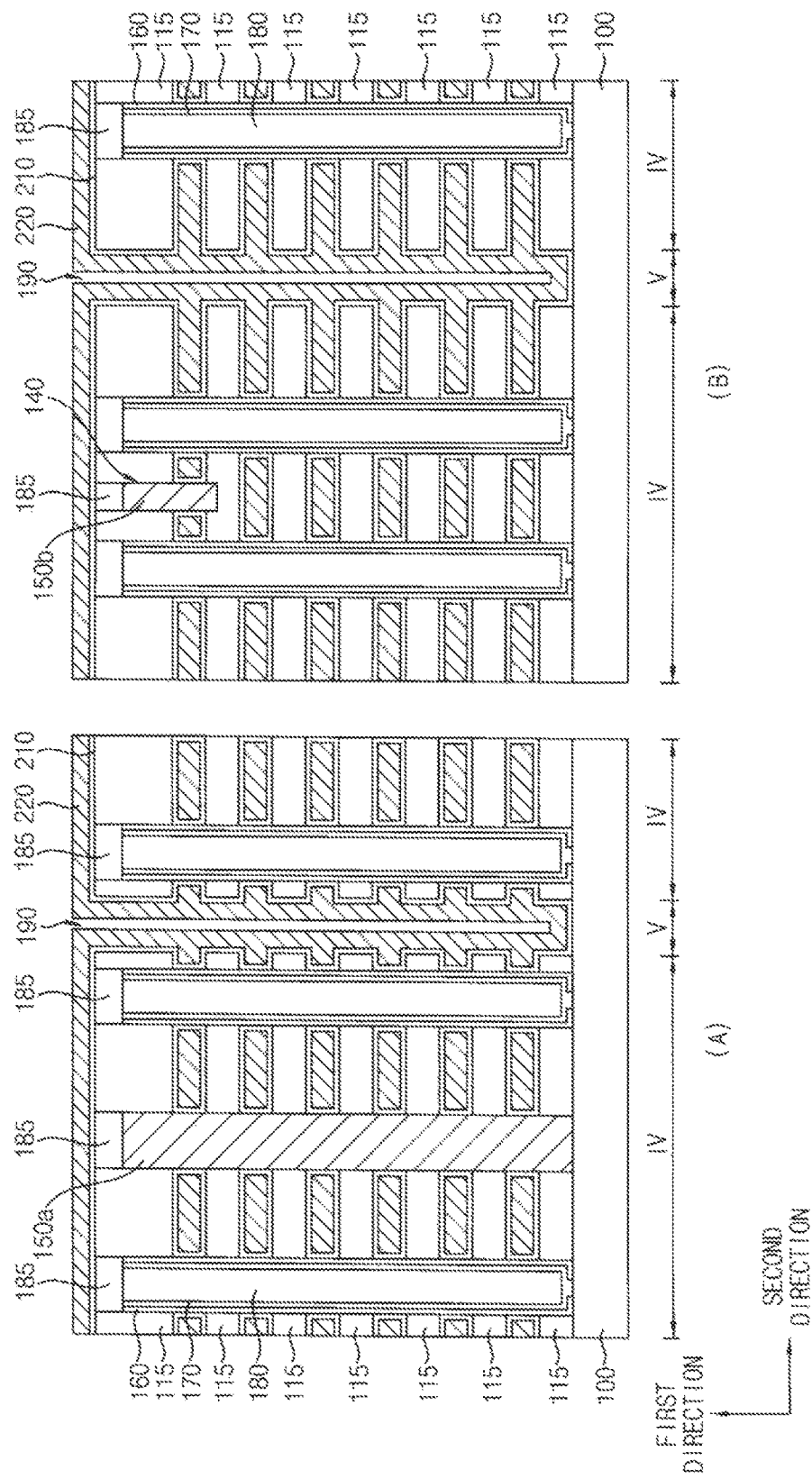

Referring to FIG. 14, a second blocking layer 210 and a gate electrode layer 220 may be sequentially formed on the exposed portion of the outer sidewall of the first blocking layer pattern 162, inner walls of the gaps 200, surfaces of the first insulation patterns 115, the exposed top surface of the substrate 100 and top surfaces of the pads 185. A gate electrode layer 220 may fill remaining portions of the gaps 200. In some example embodiments, the second blocking layer 210 may be formed using an insulation material such as aluminum oxide or silicon oxide by a sequentially flow deposition (SFD) process or an atomic layer deposition (ALD) process. In some example embodiments, the gate electrode layer 220 may be formed using a metal. For example, the gate electrode 210 may include a metal of a low resistance, e.g., tungsten, titanium, tantalum, platinum, and the like. When the gate electrode layer 220 includes tungsten, the gate electrode layer 220 may be formed by a CVD process or an ALD process using tungsten hexafluoride ($WF_6$) as a source gas.

Referring to FIG. 15, the gate electrode layer 220 may be partially removed to form a plurality of gate electrodes 222, 224 and 226 in the gaps 200.

In some example embodiments, the gate electrode layer 220 may be partially removed by, for example, a wet etch process. In some example embodiments, the plurality of gate electrodes 222, 224 and 226 may fill the gap 200. The plurality of gate electrodes 222, 224 and 226 may extend in the third direction.

The plurality of gate electrodes 222, 224 and 226 may include GSLs 226, word lines 222 and SSLs 224 sequentially located from the top surface of the substrate 100. Each of the GSLs 226, the word lines 222 and the SSLs 224 may be formed at a single level or at a plurality of levels. According to some example embodiments, each of the GSLs 226 and the SSLs 224 may be formed at single level, and the word lines 222 may be formed at 4 levels between the GSL 226 and the SSL 217. However, the number of GSLs 218, word lines, 216 and SSLs 217 is not limited thereto.

The GSLs 226 may be formed adjacent to the top surface of the substrate 100. The word lines 222 and the SSLs 224 may be formed adjacent to the channels 170, and particularly, the SSLs 224 may be formed adjacent to the connection portion 150b of the isolation pattern 150. The connection portion 150b of the isolation pattern 150 may extend in the third direction, and may penetrate the SSLs 224 in the first direction. Therefore, the SSLs 224 may be separated from each other in the second direction by the connection portion 150b.

When the gate electrode layer 220 is partially removed, portions of the second blocking layer 210 on a surface of the first insulation layer pattern 115 and on top surfaces of the substrate 100, the pads 185 and the division layer pattern 165 may also be removed to form a second blocking layer pattern 215.

In a process for partially removing the gate electrode layer 220 and the second blocking layer 210, the first opening 190 exposing the top surface of the substrate 100 and extending in the third direction may be formed again. Impurities may be implanted into the exposed top surface of the substrate 100 to form an impurity region 105. In some example embodiments, the impurities may include n-type impurities, for example, phosphorus and/or arsenic. In some example embodiments, the impurity region 105 may extend in the third direction and may serve as a common source line (CSL).

Referring to FIGS. 16A and 16B, a third insulation pattern 230 may be formed in the first opening 190. A bit line contact 260 may formed. The bit line contact 260 is electrically connected to a bit line 265.

In some example embodiments, after a third insulating interlayer filling the first opening 190 is formed on the substrate 100 and the uppermost first insulation pattern 115, an upper portion of the third insulating interlayer may be planarized until a top surface of the uppermost first insulation layer pattern 115 may be exposed to form the third insulation layer pattern 230.

A fourth insulation layer 240 may be formed on the first and third insulation layer patterns 115 and 230 and the pad 185, and a second opening may be formed to expose a top surface of the pad 185. The bit line contact 260 may be formed on the pad 185 to fill the second opening. The bit line 265 electrically connected to the bit line contact 260 may be formed.

According to some example embodiments, operations for fabricating a vertical memory device may include forming an isolation pattern 150 having extension portions 150a and connection portions 150b. The isolation pattern 150 may include an insulation material such as silicon oxide. Particularly, the isolation pattern 150 may consist essentially of an insulation material, i.e., the isolation pattern 150 may not include a conductive material or a semiconductor material. Therefore, coupling between the isolation pattern 150 and adjacent channels 170 may be reduced or prevented. Further, the connection portions 150b may separate the SSLs 224.

Figure 17:
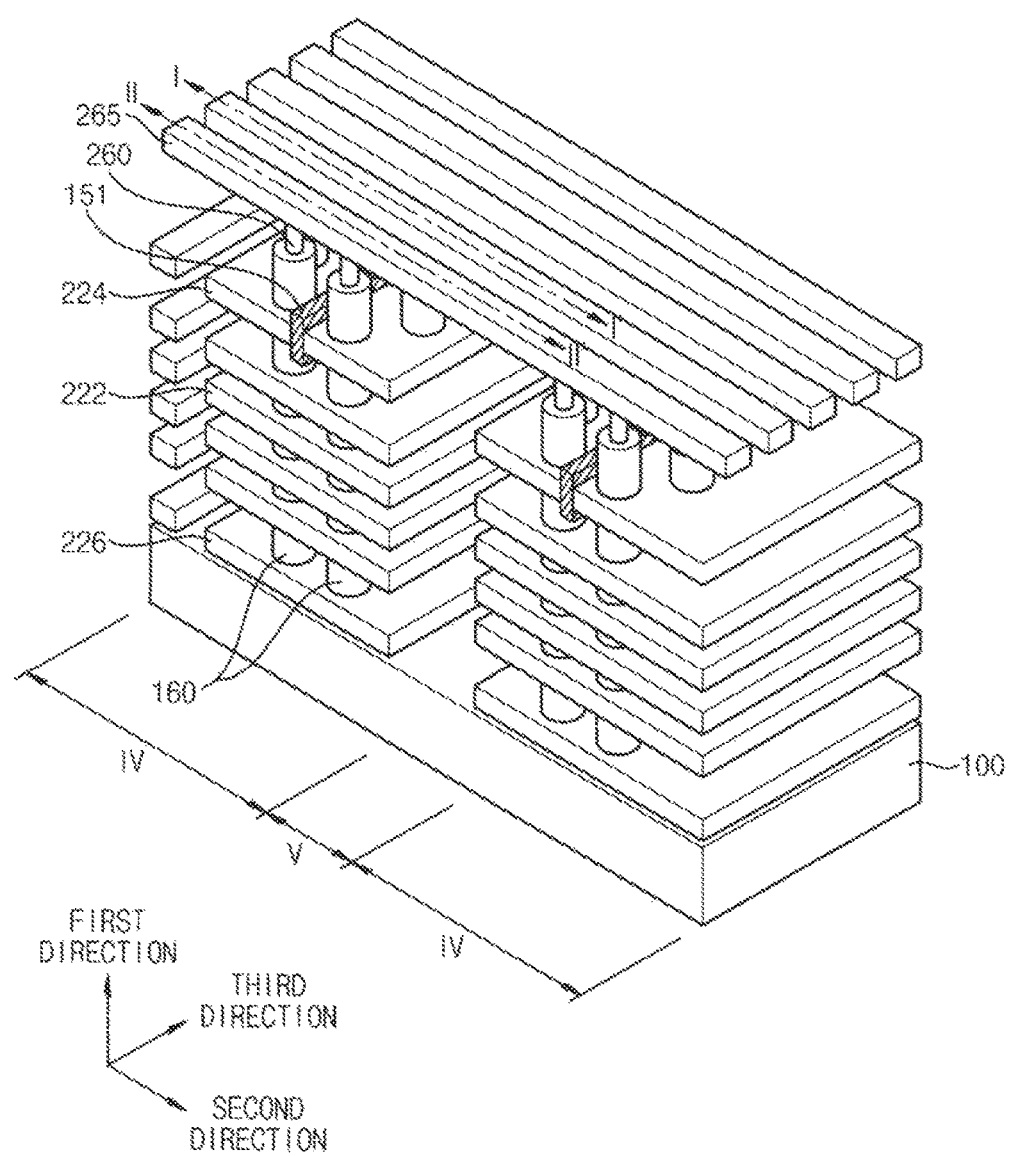
Figure 18:
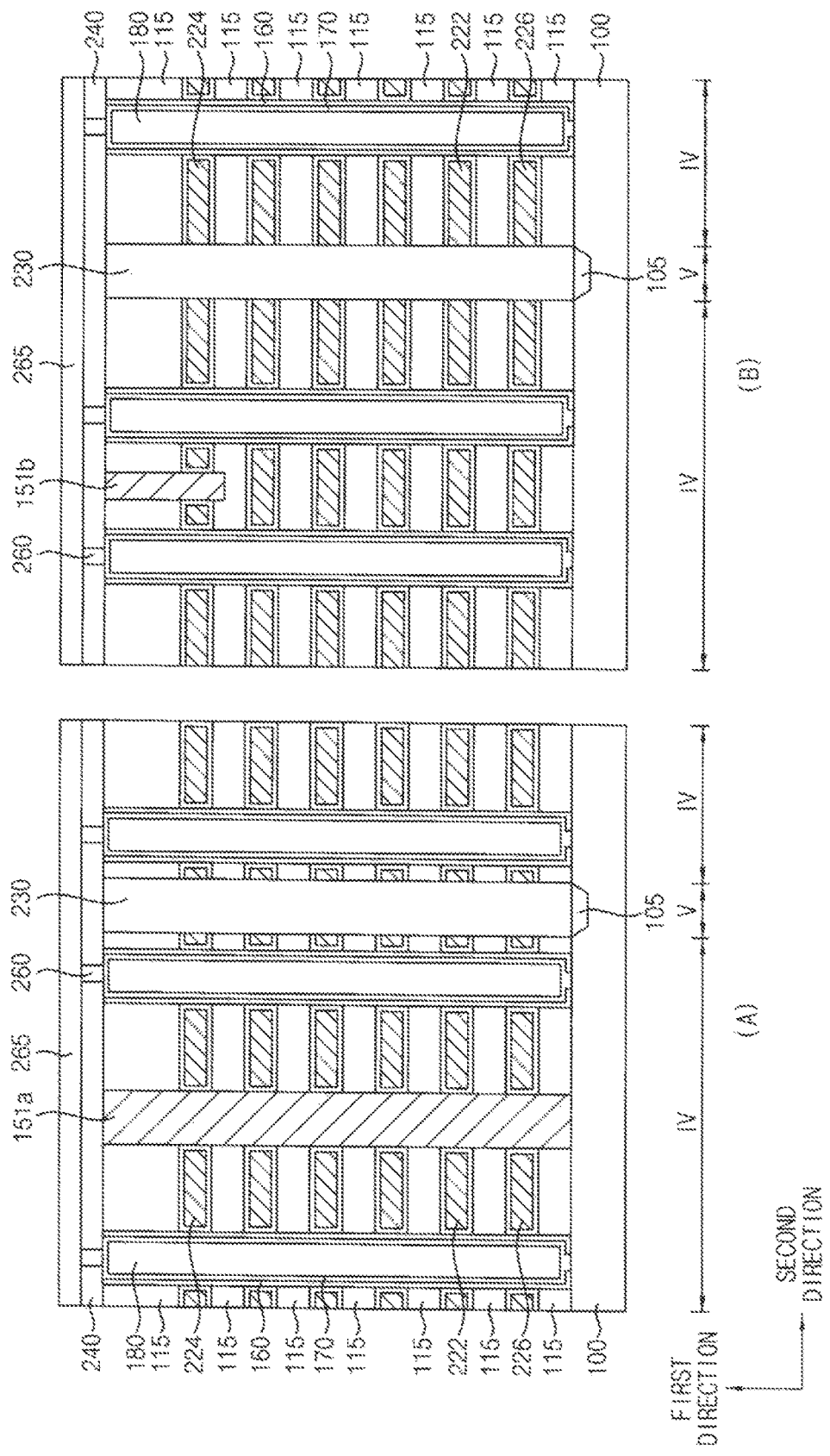

FIG. 17 is a perspective view illustrating a vertical memory device in accordance with other example embodiments, and FIG. 18 includes a vertical cross-sectional view (A) cut along the line I-I' in FIG. 17 and a vertical cross-sectional view (B) cut along the line II-II' in FIG. 17 illustrating the vertical memory device. The vertical memory device may include substantially similar features to those shown in FIGS. 1 to 4, so like reference numerals refer to like elements, and repetitive explanations thereof may be omitted.

The vertical memory device may include a plurality of channels 170, each of which may extend in a first direction on a substrate 100, and charge storage structures 160 surrounding outer sidewalls of the channels 170. The vertical memory device may further include gate electrodes 222, 224 and 226 partially covering outer sidewalls of some of the channels 170. The gate electrodes 222, 224 and 226 may be separated by first insulation layer patterns 115, third insulation layer patterns 230 and the isolation patterns 151.

Compared to the vertical memory device described with reference to FIGS. 1 to 4, the vertical memory device of FIGS. 17 and 18 may not include a pad disposed on top surfaces of the channel 170 and the isolation pattern 151. Therefore, the isolation pattern 151 of FIGS. 17 and 18 may have a different shape from the isolation pattern 150 of FIGS. 1 to 4.

The isolation patterns 151 may include a plurality of extension portions 151a extending in the first direction and a plurality of connection portions 151b connecting the extension portions 151a in the third direction. The connection portions 151b and the extension portions 151a of the isolation patterns 151 may have top surfaces substantially coplanar with top surfaces of the channels 170.

According to some example embodiments, the isolation patterns 151 may include an insulation material such as silicon oxide. Therefore, coupling between the extension portions 151a and the adjacent channels 170 may be reduced or prevented. Further, the connection portions 151b may separate the SSLs 224 in the second direction.

Figure 19:
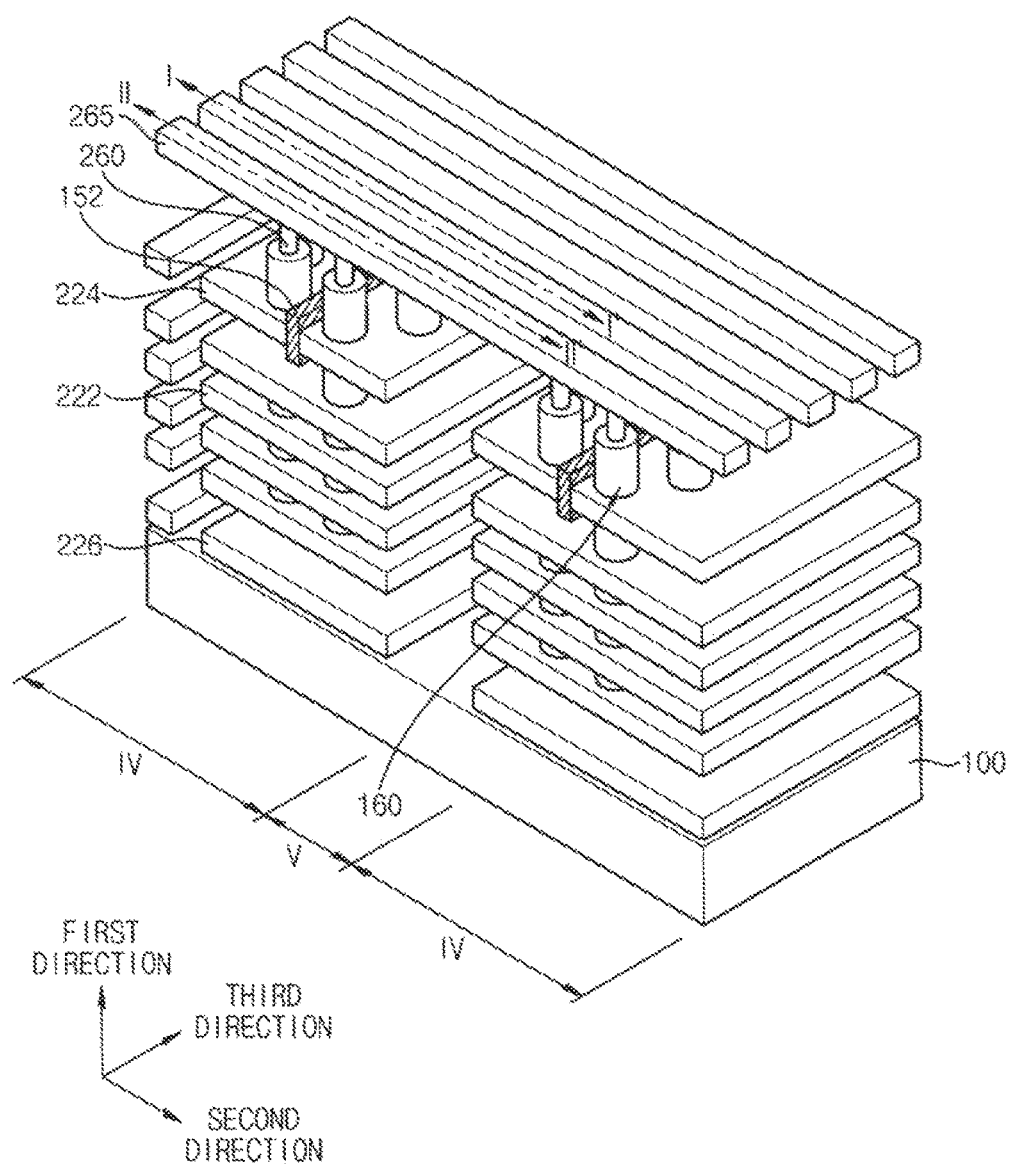
Figure 20:
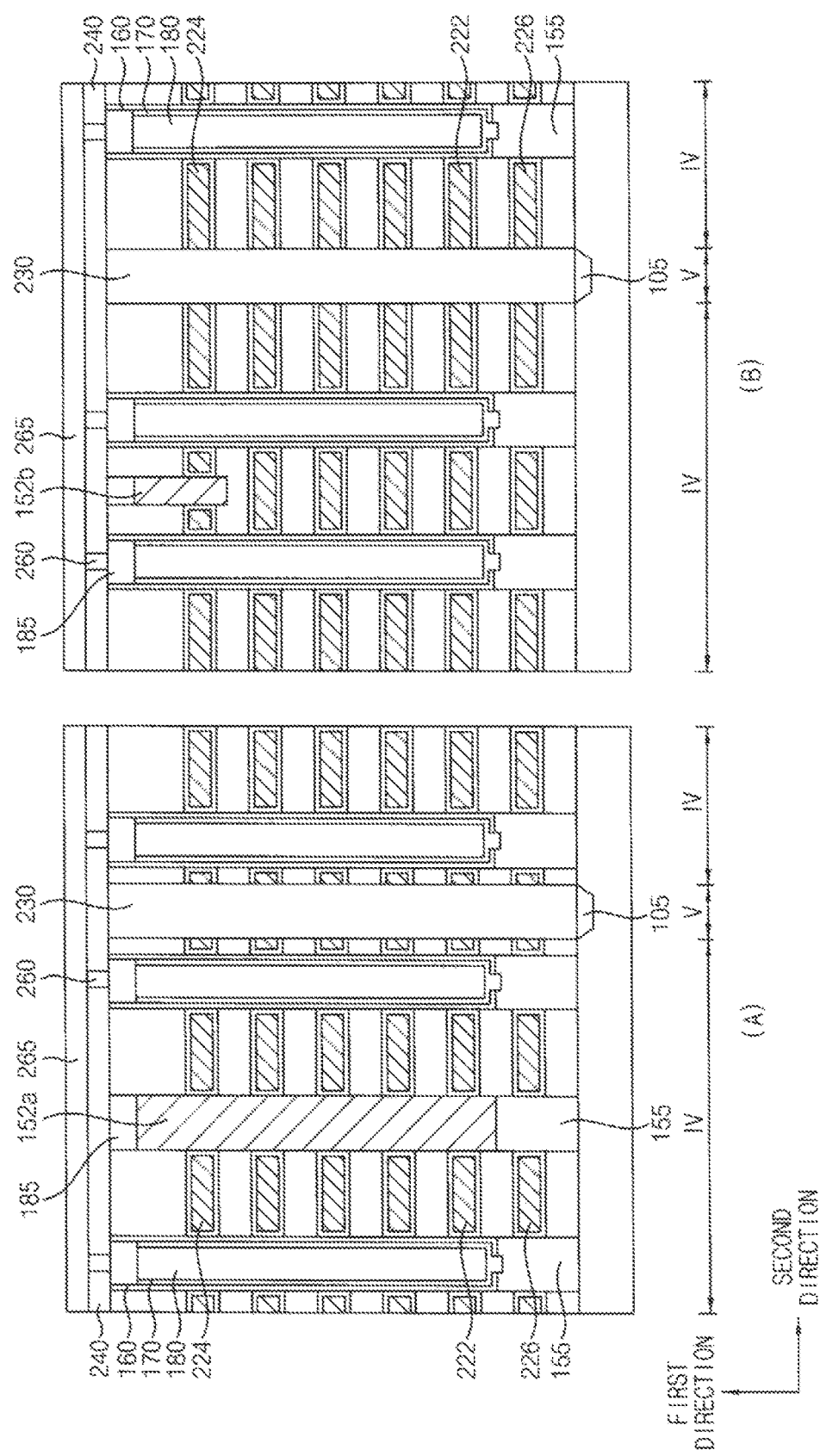

FIG. 19 is a perspective view illustrating a vertical memory-device in accordance with other example embodiments, and FIG. 20 includes a vertical cross-sectional view (A) cut along the line I-I' in FIG. 19 and a vertical cross-sectional view (B) cut along the line II-II' in FIG. 19 illustrating the vertical memory device. The vertical memory device may include features substantially similar to those shown in FIGS. 1 to 4, so like reference numerals refer to like elements, and repetitive explanations thereof may be omitted.

The vertical memory device may include a plurality of channels 170, each of which may extend in a first direction on a substrate 100, charge storage structures 160 surrounding outer sidewalls of the channels 170. The vertical memory device may include a plurality of gate electrodes 222, 224 and 226 partially covering outer sidewalls of the channels 170. The plurality of gate electrodes 222, 224 and 226 may be separated by first insulation layer patterns 115, third insulation layer patterns 230 and isolation patterns 152.

Compared to the vertical memory device described with reference to FIGS. 1 to 4, the vertical memory device of FIGS. 19 and 20 may further include a semiconductor pattern 155 between the channels 170 and a top surface of the substrate 100 and between the isolation pattern 152 and the top surface of the substrate 100. Therefore, the isolation pattern 152 of FIGS. 19 and 20 may have a different shape from the isolation pattern 150 of FIGS. 1 to 4.

The semiconductor pattern 155 may directly contact a lower portion of the channel 170 that may penetrate the charge storage structure 160. In some example embodiments, the semiconductor pattern 155 may include doped or undoped polysilicon, single crystalline polysilicon, doped or undoped polygermanium or single crystalline germanium. A GSL 226 may be disposed adjacent to a sidewall of the semiconductor pattern 155.

The isolation pattern 152 may include a plurality of extension portions 152a extending in the first direction and a plurality of connection portions 152b connecting the extension portions 152a in the third direction. A bottom surface of the extension portion 152a of the isolation pattern 152 may directly contact the top surface of the semiconductor pattern 155, and may not directly contact the top surface of the substrate 100. Therefore, the bottom surface of the extension portion 152 may be higher than a top surface of the GSLs.

According to some example embodiments, the isolation pattern 152 may include an insulation material, such as silicon oxide. Therefore, coupling between the extension portions 152a and the adjacent channels 170 may be reduced or prevented. Further, the connection portions 152b may separate the SSLs 224 in the second direction.

Figure 21:
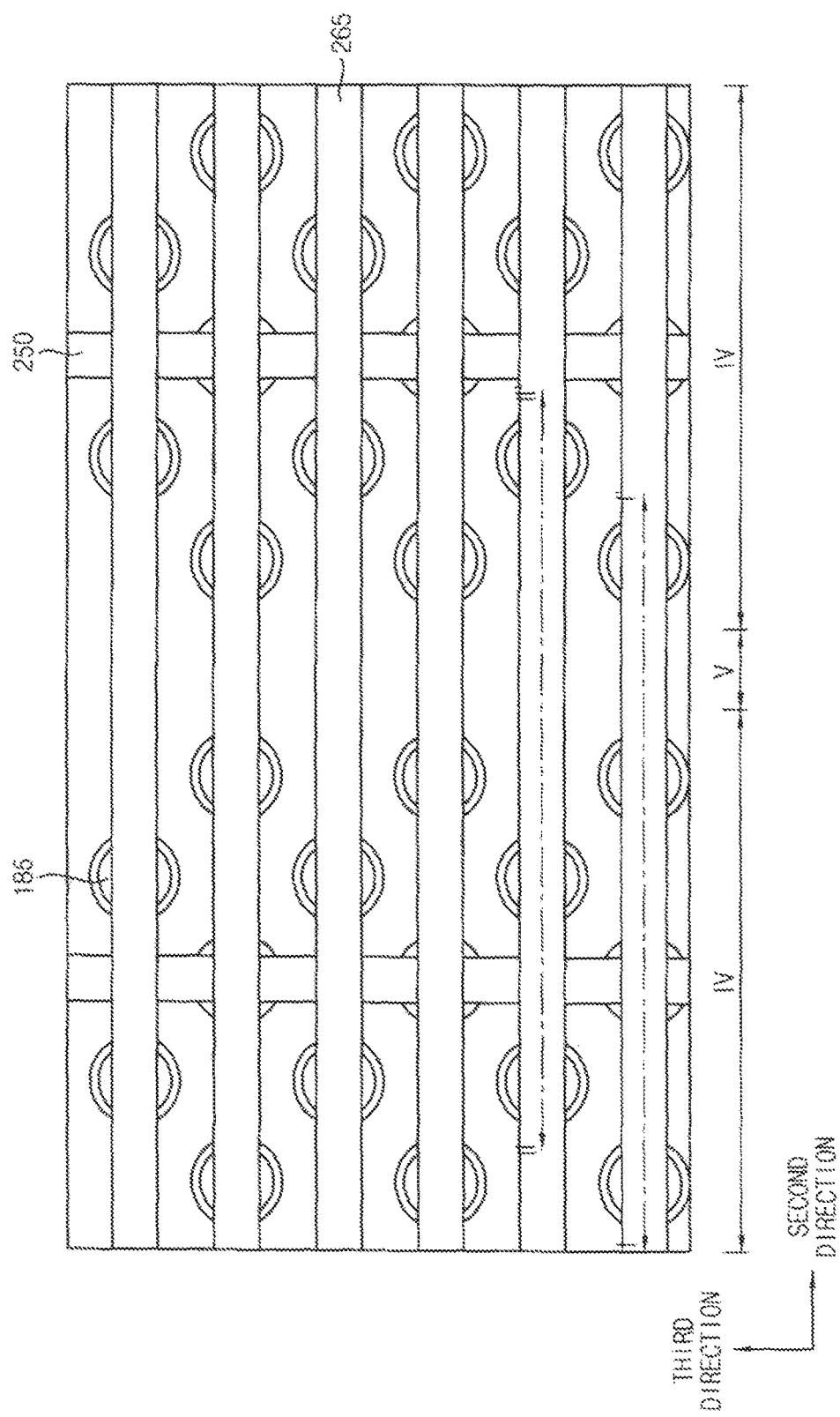
Figure 22:
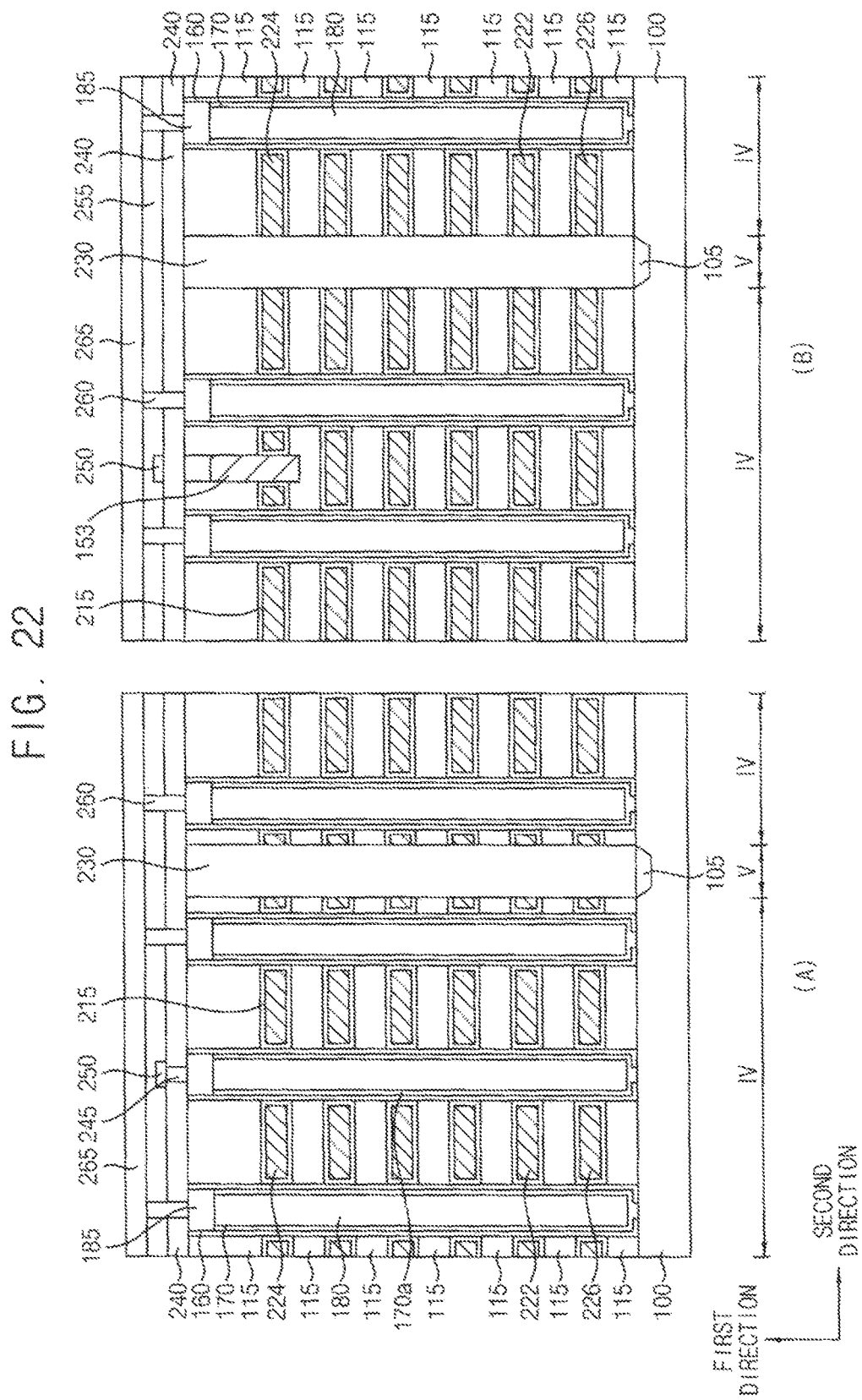

FIG. 21 is a plan view illustrating a vertical memory device in accordance with other example embodiments, and FIG. 22 includes a vertical cross-sectional view (A) cut along the line I-I' in FIG. 21 and a vertical cross-sectional view (B) cut along the line II-II' in FIG. 21 illustrating the vertical memory device. The vertical memory device include features that are substantially similar to those of FIGS. 1 to 4, so like reference numerals refer to like elements, and repetitive explanations thereof may be omitted.

The vertical memory device may include a plurality of channels 170 and 170a, each of which may extend in a first direction on a substrate 100, and charge storage structures 160 surrounding outer sidewalls of the channels 170 and 170a.

In some example embodiments, the plurality of channels 170 and 170a may be arranged in a second direction and a third direction, and thus a channel array may be defined. Dummy channels 170a may be disposed in the first holes 130a (see FIG. 7A) arranged at a central portion of the first region IV in the third direction, and regular channels 170 may be disposed in the second holes 130b and the third holes 130c (see FIG. 7A) arranged at edge portions of the first region IV in the third direction. The channels 170 may be arranged in a zigzag pattern (that is, a staggered pattern) with respect to the third direction.

The vertical memory device may include gate electrodes 222, 224 and 226 partially covering outer sidewalls of the channels 170. The gate electrodes 222, 224 and 226 may be separated by first insulation layer patterns 115, third insulation layer patterns 230 and isolation patterns 153. Further, the vertical memory device may further include bit lines 265 electrically connected to the channels 170. The dummy channels 170a in the first holes 130a may be electrically connected to the first wiring 250 by the first wiring contacts 245, and the regular channels 170 in the second holes 130b and the third holes 130c may be electrically connected to the bit lines 265 by bit line contacts 260.

In some example embodiments, first wirings 250 may be arranged in the second direction, each of the first wirings 250 may extend in the third direction. The first wirings 250 may apply a predetermined voltage to the dummy channel 170a. For example, when a memory cell of the channel 170 adjacent to the dummy channel 170a performs a program operation or a read operation, the first wiring 250 may apply 0V to the dummy channel 170a. Further, when the memory cell of the channel 170 adjacent to the dummy channel 170a performs a verification operation, the first wiring 250 may apply 0V or a positive voltage (Vcc) to the dummy channel 170a. When the memory cell of the channel 170 adjacent to the dummy channel 170a performs an erase operation, the dummy channel 170a may be floated, i.e., the electrical potential of the dummy channel 170a may be adjusted by the first wiring 250, so that coupling between the adjacent channels 170 may be reduced or prevented.

FIGS. 23A to 28B are vertical cross-sectional views and horizontal cross-sectional views illustrating operations for fabricating a vertical memory device in accordance with other example embodiments. Processes substantially the same as or similar to those illustrated with reference to FIG. 6 may be performed. First insulation layers 110 and first sacrificial layers 120 may be alternately and repeatedly formed on a substrate 100.

Figure 23B:
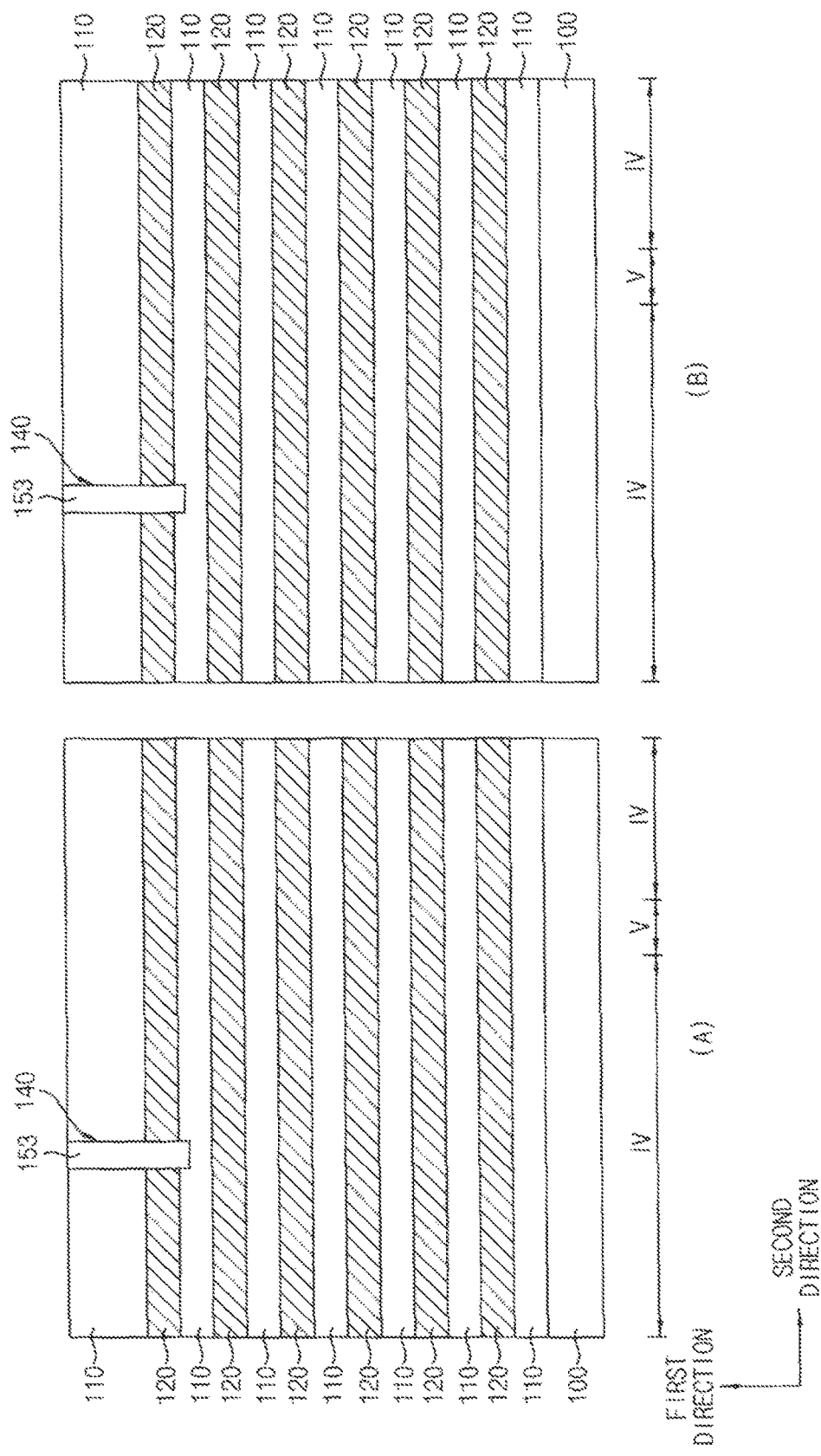

Referring to FIGS. 23A and 23B, a first trench 140 may be formed by removing portions of a first insulation layer 110 and a first sacrificial layer 120. An isolation pattern 153 may be formed in the first trench 140.

In some example embodiments, the first trench 140 may penetrate a specific first sacrificial layer 120, in which the SSLs 217 (see FIG. 15) may be subsequently formed, and the first insulation layer 110 disposed above the specific first sacrificial layer 120. After forming an isolation layer on the third insulation layer 110 to fill the first trench 140, an upper portion of the isolation layer may be planarized until a top surface of the first insulation layer 110 is exposed, thereby forming the isolation pattern 153. For example, the isolation layer may be formed using an insulation material, such as silicon oxide.

Referring to FIGS. 24A and 24B, a plurality of holes 130 may be formed through the first insulation layers 110 and the first sacrificial layers 120 to expose a top surface of the substrate 100. The process for forming the plurality of holes 130 may be substantially the similar to that described with reference to FIGS. 7A and 7B. The plurality of holes 130a, 130b and 130c may be arranged in the second direction and the third direction.

Figure 25B:
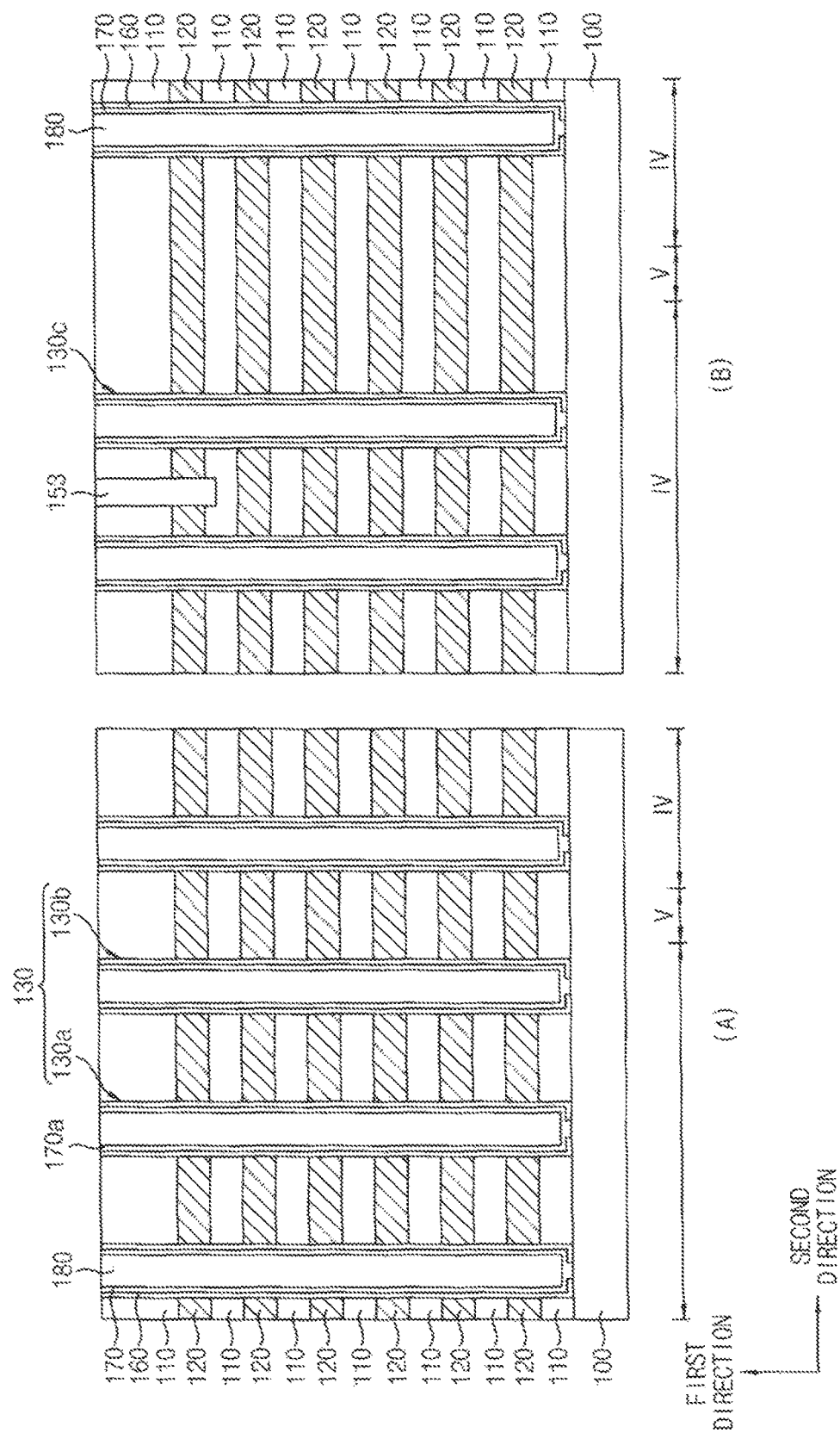

Referring to FIGS. 25A and 25B, a charge storage structure 160, a channel 170 and a second insulation layer pattern 180 may be formed in each of the holes 130a, 130b and 130c. The process for forming the charge storage structures 160, the channels 170 and the second insulation layer patterns 180 may be substantially the similar to that described with reference to FIGS. 11A, 11B and 11C. However, the charge storage structures 160, the channels 170 and the second insulation layer patterns 180 may be formed not only in the second hole 130b and the third hole 130c but also in the first holes 130a.

Referring to FIGS. 26A and 26B, pads 185 may be formed on the channels 170, the charge storage structures 160 and the second insulation layer patterns 180, and a first opening 190 may be formed through the first insulation layer 110 and the first sacrificial layer 120. After removing the first sacrificial layers 120, gate electrodes 222, 224 and 225 and a second blocking layer pattern 215 may be formed using processes substantially similar to those described with reference to FIGS. 12 to 15. Further, common source line contacts 235 may be formed through a third insulation layer pattern 230 in a second region V of the substrate 100, such that the common source line contact 235 may be electrically connected to the impurity regions 105.

Figure 27B:
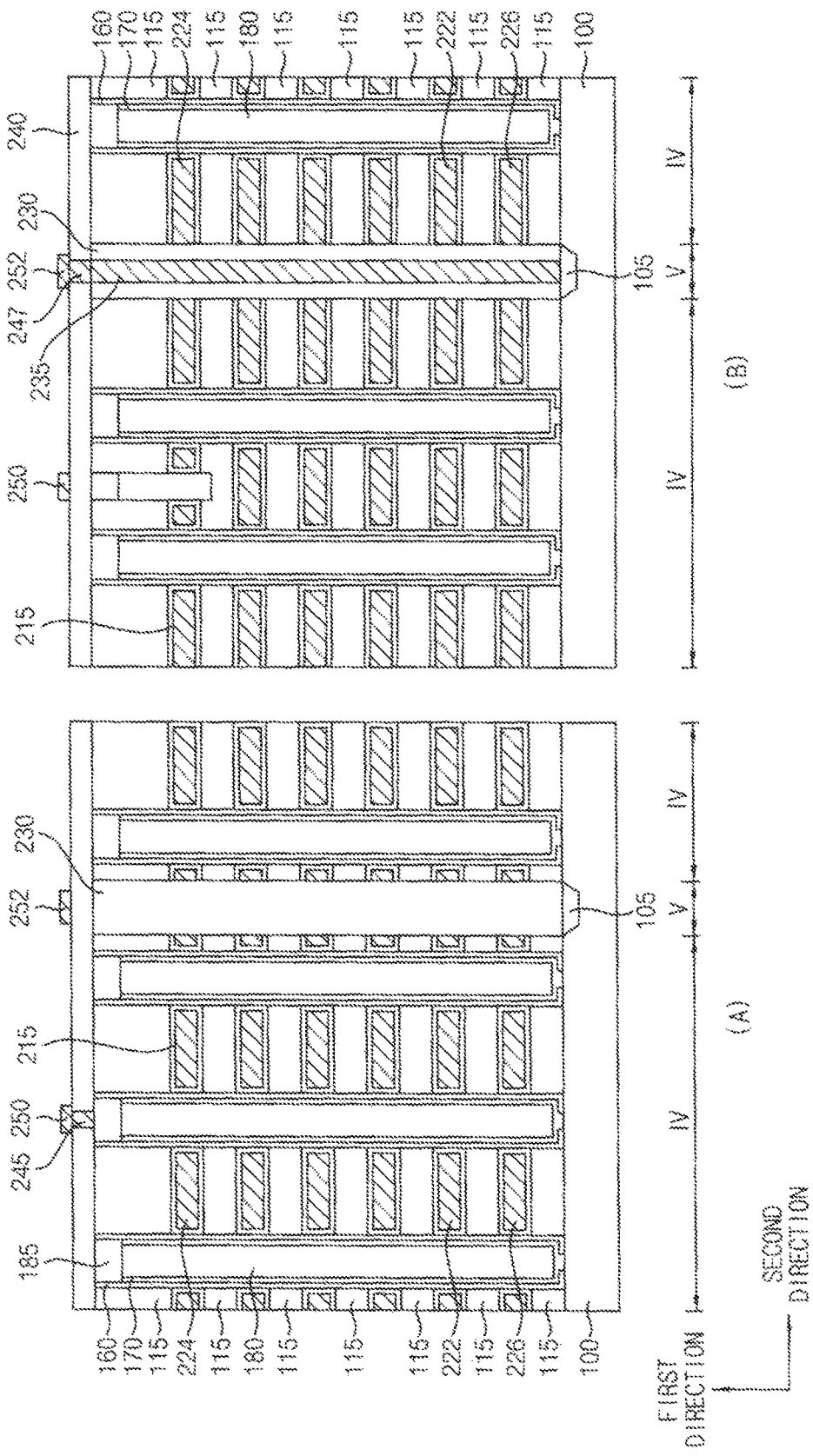

Referring to FIGS. 27A and 27B, first contacts 245 and second contacts 247 may be formed. First wirings 250 and second wirings 252 may be formed. After forming a fourth insulation layer 240 on the first insulation layer pattern 115, pads 185 and third insulation layer patterns 230, the first and second contacts 245 and 247 may be formed to penetrate the fourth insulation layer 240. The first wirings 250 may be formed to be electrically connected to the first contacts 245 and the second wirings 252 may be formed to be electrically connected to the second contacts 247.

In some example embodiments, the first wirings 250 and the second wirings 252 may extend in the third direction. The first contacts 245 may directly contact top surfaces of the pads 185 filling the first holes 130a, so that the channels 170 in the first holes 130a may be electrically connected to the first wirings 250 by the first contacts 245 and the pads 185.

Further, the second contacts 247 may directly contact top surfaces of the common source line contacts 235, so that the impurity region 105 may be electrically connected to the second wiring 252 by the first second contact 245 and the common source line contact 235.

The first contacts 245 and the second contacts 247 may be formed simultaneously. Further, the first wirings 250 and the second wiring 252 may be formed simultaneously. Therefore, the first contacts 245 and the first wirings 250 may be formed without an additional process.

Figure 28A:
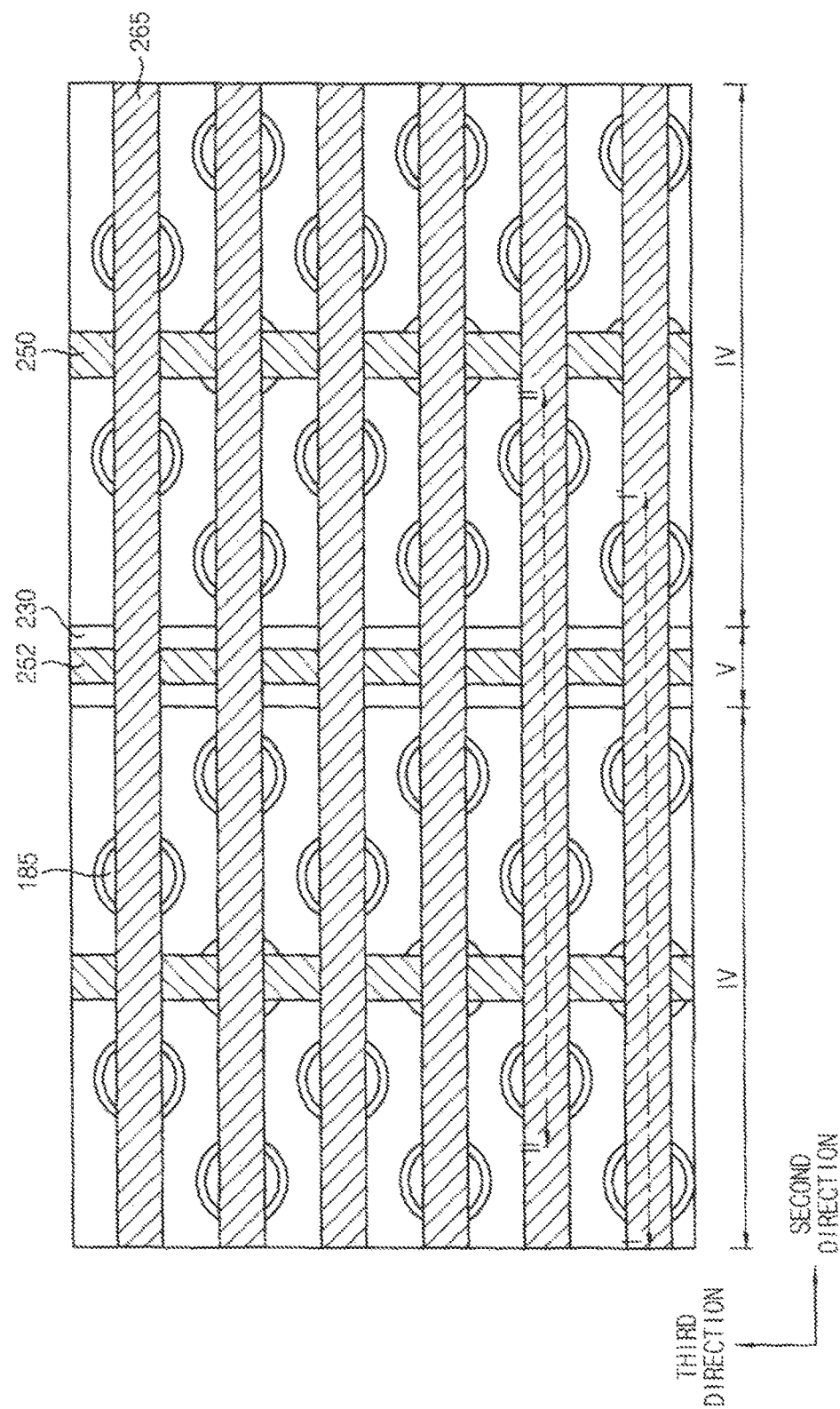

Referring to FIGS. 28A and 28B, bit line contacts 260 and bit lines 265 may be formed. After forming a fifth insulation layer 255 on the first and second wirings 250 and 252 and the fourth insulation layer 240, the bit line contacts 260 may be formed through the fourth insulation layer 240 and the fifth insulation layer 255. The bit lines 265 electrically connected to the bit line contacts 260 may be formed on the fifth insulation layer 255.

In some example embodiments, a plurality of bit lines 265 may be arranged in the third direction, and each of the bit lines 265 may extend in the second direction. Therefore, the bit lines 265 may be substantially perpendicular to the first wirings 250. Further, the bit line contacts 260 may directly contact top surfaces of the pads 185 in the second holes 130b and the third holes 130c, so that the channels 170 in the second holes 130b and the third holes 130c may be electrically connected to the bit lines 265 by the bit line contacts 260 and the pads 185.

The first wirings 250 may apply a predetermined voltage to the channel 170 in the first hole 130a (hereinafter referred to as a dummy channel). For example, when a memory cell of the channel 170 performs a program operation or a read operation, the first wiring 250 may apply 0V to the dummy channel. Further, when the memory cell of the channel 170 performs a verification operation, the first wiring 250 may apply 0V or a positive voltage (Vcc) to the dummy channel. When the memory cell of the channel 170 performs an erase operation, the dummy channel may be floated. That is, the electrical potential of the dummy channel 170a may be adjusted by the first wiring 250, so that coupling between the channels 170 may be reduced or prevented.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive subject matter. Accordingly, all such modifications are intended to be included within the scope of the present inventive subject matter as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
a plurality of vertical channels extending upwards from a substrate in a first direction and arranged as a channel array on the substrate in perpendicular second and third directions that are each perpendicular to the first direction;
a plurality of charge storage structures surrounding the plurality of the vertical channels, respectively, thereby extending in the first direction;
a plurality of plate-shaped gate electrodes extending in the second and third directions and arranged on sidewalls of the plurality of the charge storage structures and configured to form gate structures together with the charge storage structures, the gate structures including at least a ground selection line (GSL), at least a string selection line (SSL) and a plurality of word lines (WL) interposed between the GSL and the SSL; and
an isolation pattern between adjacent ones of the charge storage structures, the isolation pattern including columnar vertical extension portions that extend along the vertical channels in the first direction, are spaced apart along the third direction, have a first width along the second direction, and have bottom surfaces making contact with the substrate and top surfaces higher than the SSL and connection portions that connect the vertical extension portions in the third direction and have bottom surfaces over the WL and have a second width along the second direction that is less than the first width, wherein the vertical extension portions and the connection portions form a continuous insulation material region and wherein the vertical extension portions are solid columns of insulating material.

2. The vertical memory device of claim 1, wherein the vertical extension portions have a column shape corresponding to the charge storage structure and the connection portions have a line shape extending in the third direction and interposed between a pair of adjacent vertical extension portions.

3. The vertical memory device of claim 2, wherein the vertical extension portions are shaped into pillars having a diameter corresponding to an outer diameter of the charge storage structure and the connection portions have a line width smaller than the diameter of the pillars in the second direction.

4. The vertical memory device of claim 1, wherein a gap distance between a pair of the vertical channels symmetrically adjacent the vertical extension portion in the second direction at the vertical extension portion is larger than a gap distance between a pair of the vertical channels symmetrically adjacent the connection portion in the second direction at the connection portion.

5. The vertical memory device of claim 1, wherein the vertical channels are positioned alternately close to the vertical extension portions and the connection portions of the isolation pattern, so that the vertical channels are arranged in a zigzag pattern along the third direction.

6. The vertical memory device of claim 5, wherein the vertical channels around the connection portions are closer to the isolation pattern than the vertical channels around the vertical extension portions.

7. The vertical memory device of claim 1, wherein the SSL is separated into a pair of line pieces by the connection portion of the isolation pattern along the second direction.

8. The vertical memory device of claim 1, wherein the vertical extension portions have a height substantially same as a height of the charge storage structures.

9. The vertical memory device of claim 1, further comprising a conductive pad disposed on the vertical channels and the isolation pattern.

10. The vertical memory device of claim 9, wherein a bottom surface of the conductive pad is higher than a top surface of the SSL.

11. The vertical memory device of claim 1, wherein the isolation pattern consists essentially of an insulation material.

12. The vertical memory device of claim 1, wherein the vertical extension portions lack semiconductor material.

* * * * *